(12) United States Patent
Zhang et al.

(10) Patent No.: US 11,626,738 B2
(45) Date of Patent: Apr. 11, 2023

(54) PHOTOVOLTAIC SYSTEM

(71) Applicant: Huawei Digital Power Technologies Co., Ltd., Shenzhen (CN)

(72) Inventors: Yanzhong Zhang, Shanghai (CN); Zhenhuan Shu, Shanghai (CN); Xun Wang, Shanghai (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/353,925

(22) Filed: Jun. 22, 2021

(65) Prior Publication Data

US 2021/0313808 A1 Oct. 7, 2021

Related U.S. Application Data

(63) Continuation of application No. PCT/CN2019/130037, filed on Dec. 30, 2019.

(30) Foreign Application Priority Data

Dec. 29, 2018 (CN) .......................... 201811641390.5

(51) Int. Cl.
*H02J 3/38* (2006.01)

(52) U.S. Cl.
CPC ........... *H02J 3/381* (2013.01); *H02J 2300/26* (2020.01)

(58) Field of Classification Search
CPC ........ H02J 3/381; H02J 2300/26; H02J 3/383; H01L 31/02021; H02S 50/00; Y02E 10/56
See application file for complete search history.

(56) References Cited

U.S. PATENT DOCUMENTS

2014/0001864 A1* 1/2014 Nirantare .......... H01L 31/02021
307/71
2014/0265603 A1 9/2014 Augustoni et al.
(Continued)

FOREIGN PATENT DOCUMENTS

| CN | 203840274 U | 9/2014 |
| CN | 204031043 U | 12/2014 |
| CN | 105811875 A | 7/2016 |

(Continued)

OTHER PUBLICATIONS

Office Action issued in CN201811641390.5, dated Apr. 30, 2020, 10 pages.
(Continued)

*Primary Examiner* — Toan T Vu

(57) ABSTRACT

This application relates to the field of power technologies, and provides a photovoltaic system, which can increase a working voltage of a photovoltaic string. The photovoltaic system includes an adapter circuit, a first photovoltaic string, a second photovoltaic string, and a controller. The controller includes an inverter or a combiner box. The first photovoltaic string and the second photovoltaic string are configured to provide electric energy for the controller. The adapter circuit is configured to be connected to the first photovoltaic string in series, and further configured to connect the second photovoltaic string to the first photovoltaic string in series when a voltage of the first photovoltaic string is lower than a preset threshold.

18 Claims, 14 Drawing Sheets

(56) References Cited

U.S. PATENT DOCUMENTS

2015/0028683 A1* 1/2015 Hadar ................. H02J 3/46
　　　　　　　　　　　　　　　　　　　　　　　　307/80
2019/0013420 A1* 1/2019 Nesemann ........ H01L 31/02021

FOREIGN PATENT DOCUMENTS

| | | |
|---|---|---|
| CN | 106602504 A | 4/2017 |
| CN | 107943194 A | 4/2018 |
| CN | 207543025 U | 6/2018 |
| CN | 108781055 A | 11/2018 |
| CN | 109638882 A | 4/2019 |
| EP | 3410551 A1 | 12/2018 |
| FR | 2946797 B1 | 3/2012 |
| WO | 2009060273 A1 | 5/2009 |

OTHER PUBLICATIONS

International Search Report and Written Opinion issued in PCT/CN2019/130037, dated Mar. 27, 2020, 10 pages.

Zhao Zhengming et al., Abstract of "Solar photovoltaic power generation maximum power point tracking technology", Electronic Industry Press, 2012, with English machine translation, total 6 pages.

Office Action issued in CN201811641390.5, dated Jan. 13, 2022, 9 pages.

Extended European Search Report issued in EP19906014.6, dated Sep. 24, 2021, 9 pages.

\* cited by examiner

PHOTOVOLTAIC SYSTEM

CROSS-REFERENCE TO RELATED APPLICATIONS

This application is a continuation of International Application No. PCT/CN2019/130037 filed on Dec. 30, 2019, which claims priority to Chinese Patent Application No. 201811641390.5 filed on Dec. 29, 2018, The disclosures of the aforementioned applications are hereby incorporated by reference in their entireties.

TECHNICAL FIELD

This application relates to the field of power technologies, and in particular, to a photovoltaic system.

BACKGROUND

At present, in a power system, power may be generated by using a photovoltaic system. Generally, the photovoltaic system includes a plurality of photovoltaic strings, each of which includes a plurality of photovoltaic modules connected in series. The strings are configured to convert solar energy into electric energy. The plurality of strings are connected to one or more inverters. Electric energy that is output by the inverter may be used to supply power to a load.

Generally, a quantity of photovoltaic modules included in each string is related to an open-circuit voltage of a single photovoltaic module. A higher open-circuit voltage of a single photovoltaic module indicates a smaller quantity of photovoltaic modules that can be included in each string. An open-circuit voltage of a photovoltaic module is related to an ambient temperature. A lower temperature indicates a higher open-circuit voltage of a photovoltaic module and a smaller quantity of photovoltaic modules that can be included in a string. It can be learned that, for a same string, if a working voltage of the string is normal at a low temperature, when the temperature increases, the working voltage of the string decreases correspondingly, and working power also decreases correspondingly, resulting in failure to meet an electric energy yield requirement.

To increase the power of the string, according to a solution proposed in the prior art, each photovoltaic module is connected to a step-down converter, to include more photovoltaic modules by reducing a voltage of a single photovoltaic module.

However, each photovoltaic module being equipped with a step-down converter leads to a relatively large quantity of step-down converters, resulting in a complex structure of the photovoltaic system. In addition, a loss of efficiency is brought by a voltage step down of the step-down converter, resulting in a relatively low electric energy yield.

SUMMARY

Embodiments of this application provide a photovoltaic system, which can increase a working voltage of a photovoltaic string in the photovoltaic system.

To achieve the foregoing objective, the following technical solutions are used in the embodiments of this application.

According to a first aspect, an embodiment of this application provides a photovoltaic system, including: an adapter circuit, a first photovoltaic string, a second photovoltaic string, and a controller. The controller includes an inverter or a combiner box.

The first photovoltaic string and the second photovoltaic string are configured to provide electric energy for the controller.

The adapter circuit is configured to be connected to the first photovoltaic string in series, and further configured to connect the second photovoltaic string to the first photovoltaic string in series when a voltage of the first photovoltaic string is lower than a preset threshold.

In this way, connecting the second photovoltaic string to the first photovoltaic string means that a quantity of photovoltaic strings that are connected to the photovoltaic system and that output power to the controller increases, or in other words, a quantity of photovoltaic modules that output power to the controller increases, so that a working voltage of an overall photovoltaic string can be increased, thereby increasing an electric energy yield. In addition, one adapter circuit may control the second photovoltaic string to be connected to the first photovoltaic string, which means that one adapter circuit may control a plurality of photovoltaic modules to be connected to the photovoltaic system in series. Therefore, there is no need to separately configure a connection control circuit for each photovoltaic module, thereby simplifying a structure of the photovoltaic system.

In a possible design, a specific structure of the photovoltaic system may be as follows: The adapter circuit includes a control circuit, a first switch, and a first element. A first end of the first element is connected to an output end of the first photovoltaic string, a second end of the first element is connected to an input end of the controller, and the first element is configured to connect the first photovoltaic string to the controller when the controller is not powered on, and further configured to disable a path between the first photovoltaic string and the controller when the voltage of the first photovoltaic string is lower than the preset threshold, and to disable the path between the first photovoltaic string and the controller when the voltage of the first photovoltaic string exceeds the preset threshold.

A non-movable end of the first switch is connected to the first end of the first element or an input end of the second photovoltaic string, a movable end of the first switch is connected to the control circuit, the first switch is configured to be opened or closed under control of the control circuit, and connect the second photovoltaic string to the first photovoltaic string in series in a closed state, and when the controller is not powered on, the first switch is in an open-circuit state by default.

An output end of the second photovoltaic string is connected to an output end of the first element.

The control circuit is configured to: when the voltage of the first photovoltaic string is lower than the preset threshold, control the first switch to be closed.

Optionally, the first element is a transistor, a positive electrode of the transistor is connected to the output end of the first photovoltaic string, and a negative electrode of the transistor is connected to the input end of the controller.

Optionally, the first element is a second switch, a non-movable end of the second switch is connected to the output end of the first photovoltaic string or the input end of the controller, and a movable end of the second switch is connected to the control circuit.

In a possible design, a specific structure of the photovoltaic system may be as follows: A first end of a first element is connected to a first switch, a second end of the first element is connected to an input end of the first photovoltaic string, and the first element is configured to connect the first photovoltaic string to the controller when the controller is not powered on, and further configured to disable a path between the first photovoltaic string and the controller when the voltage of the first photovoltaic string is lower than the preset threshold or the voltage exceeds the preset threshold.

A non-movable end of the first switch is connected to the first end of the first element or an input end of the second photovoltaic string, a movable end of the first switch is connected to a control circuit, the first switch is configured to be opened or closed under control of the control circuit, and connect the second photovoltaic string to the first photovoltaic string in a closed state, and when the controller is not powered on, the first switch is in an open state by default.

An output end of the second photovoltaic string is connected to the second end of the first element.

The control circuit is configured to: when the voltage of the first photovoltaic string is lower than the preset threshold, control the first switch to be closed.

An output end of the first photovoltaic string is connected to the controller.

Optionally, the first element is a transistor, a positive electrode of the transistor is connected to the first switch, and a negative electrode of the transistor is connected to the input end of the first photovoltaic string.

Optionally, the first element is a second switch, a non-movable end of the second switch is connected to the first switch or the input end of the first photovoltaic string, and a movable end of the second switch is connected to the control circuit.

In a possible design, a specific structure of the photovoltaic system may be as follows: A first end of a first element is connected to an output end of a first photovoltaic module in the first photovoltaic string, a second end of the first element is connected to an input end of a second photovoltaic module in the first photovoltaic string, and the first element is configured to connect the first photovoltaic string to the controller when the controller is not powered on, and further configured to disable a path between the first photovoltaic string and the controller when the voltage of the first photovoltaic string is lower than the preset threshold, and to disable the path between the first photovoltaic string and the controller when the voltage of the first photovoltaic string exceeds the preset threshold. The first photovoltaic module is a front photovoltaic module of two adjacent photovoltaic modules in the first photovoltaic string, and the second photovoltaic module is a rear photovoltaic module of the two adjacent photovoltaic modules in the first photovoltaic string.

A non-movable end of the first switch is connected to the first end of the first element or an input end of the second photovoltaic string, a movable end of the first switch is connected to a control circuit, and the first switch is configured to be opened or closed under control of the control circuit, and connect the second photovoltaic string to the first photovoltaic string in a closed state.

An output end of the second photovoltaic string is connected to the second end of the first element.

The control circuit is configured to: when the voltage of the first photovoltaic string is lower than the preset threshold, control the first switch to be closed.

An output end of a photovoltaic module located at a tail end of the first photovoltaic string is connected to an input end of the controller.

Optionally, the first element is a transistor, a positive electrode of the transistor is connected to the output end of the first photovoltaic module, and a negative electrode of the transistor is connected to the input end of the second photovoltaic module.

Optionally, the first element is a second switch, a non-movable end of the second switch is connected to the output end of the first photovoltaic module or the input end of the second photovoltaic module, and a movable end of the second switch is connected to the control circuit.

In a possible design, a specific structure of the photovoltaic system may be as follows: A first end of a second element is connected to an output end of the first photovoltaic string, a second end of the second element is connected to an input end of the controller, and the second element is configured to connect the first photovoltaic string to the controller when the controller is not powered on, and further configured to disable a path between the first photovoltaic string and the controller when the voltage of the first photovoltaic string is lower than the preset threshold or the voltage is greater than the preset threshold.

A first input end of a converter circuit is connected to an input end of the second photovoltaic string, a second input end of the converter circuit is connected to an output end of the second photovoltaic string, a first output end of the converter circuit is connected to the first end of the second element, a second output end of the converter circuit is connected to the second end of the second element, the converter circuit is further connected to a control circuit, and the converter circuit is configured to connect the second photovoltaic string to the first photovoltaic string under control of the control circuit. When the controller is not powered on, an output voltage value between the first output end and the second output end of the converter circuit is 0 or a value less than a third threshold.

The control circuit is configured to: when the voltage of the first photovoltaic string is lower than the preset threshold, control the converter circuit to connect the second photovoltaic string to the first photovoltaic string.

Optionally, the second element is a transistor, a positive electrode of the transistor is connected to the output end of the first photovoltaic string, and a negative electrode of the transistor is connected to the input end of the controller.

Optionally, the second element is a second switch, a non-movable end of the second switch is connected to the output end of the first photovoltaic string or the input end of the controller, and a movable end of the second switch is connected to the control circuit.

In a possible design, a specific structure of the photovoltaic system may be as follows: A second end of a second element is connected to an input end of the first photovoltaic string, and the second element is configured to connect the first photovoltaic string to the controller when the controller is not powered on, and further configured to disable a path between the first photovoltaic string and the controller when the voltage of the first photovoltaic string is lower than the preset threshold or the voltage of the first photovoltaic string is greater than the preset threshold.

A first input end of a converter circuit is connected to an input end of the second photovoltaic string, a second input end of the converter circuit is connected to an output end of the second photovoltaic string, a first output end of the converter circuit is connected to the first end of the second element, a second output end of the converter circuit is connected to the second end of the second element, the converter circuit is further connected to a control circuit, and the converter circuit is configured to connect the second photovoltaic string to the first photovoltaic string under control of the control circuit. When the controller is not powered on, an output voltage value between the first output end and the second output end of the converter circuit is 0 or a value less than a third threshold.

The control circuit is configured to: when the voltage of the first photovoltaic string is lower than the preset threshold, control the converter circuit to connect the second photovoltaic string to the first photovoltaic string.

An output end of the first photovoltaic string is connected to an input end of the controller.

Optionally, the first element is a second switch, a non-movable end of the second switch is connected to the first input end of the converter circuit or the input end of the first photovoltaic string, and a movable end of the second switch is connected to the control circuit.

Optionally, the first element is a transistor, a positive electrode of the transistor is connected to the first output end of the converter circuit, and a negative electrode of the transistor is connected to the input end of the first photovoltaic string.

In a possible design, a specific structure of the photovoltaic system may be as follows: A first end of a second element is connected to an output end of a first photovoltaic module, a second end of the second element is connected to an input end of a second photovoltaic module, and the second element is configured to connect the first photovoltaic string to the controller when the controller is not powered on, and further configured to disable a path between the first photovoltaic string and the controller when the voltage of the first photovoltaic string is lower than the preset threshold or the voltage of the first photovoltaic string is greater than the preset threshold. The first photovoltaic module is a front photovoltaic module of two adjacent photovoltaic modules in the first photovoltaic string, and the second photovoltaic module is a rear photovoltaic module of the two adjacent photovoltaic modules in the first photovoltaic string.

A first input end of a converter circuit is connected to an input end of the second photovoltaic string, a second input end of the converter circuit is connected to an output end of the second photovoltaic string, a first output end of the converter circuit is connected to the first end of the second element, a second output end of the converter circuit is connected to the second end of the second element, the converter circuit is further connected to a control circuit, and the converter circuit is configured to connect the second photovoltaic string to the first photovoltaic string under control of the control circuit, and further configured to output a first voltage value under control of the control circuit. The first voltage value is 0, or the voltage value is less than a third threshold.

The control circuit is configured to: when the voltage of the first photovoltaic string is lower than the preset threshold, control the converter circuit to connect the second photovoltaic string to the first photovoltaic string, and further configured to: when the controller is not powered on, control the converter circuit to output the first voltage value.

Optionally, the first element is a transistor, a positive electrode of the transistor is connected to the output end of the first photovoltaic module, and a negative electrode of the transistor is connected to the input end of the second photovoltaic module.

Optionally, the first element is a second switch, a non-movable end of the second switch is connected to the output end of the first photovoltaic module or the input end of the second photovoltaic module, and a movable end of the second switch is connected to the control circuit.

DESCRIPTION OF EMBODIMENTS

The terms "first" and "second" in the specification and accompanying drawings of this application are used to distinguish different objects or distinguish different processing on a same object, rather than describe a specific order of objects. In addition, the terms "including", "comprising", or any other variant thereof mentioned in descriptions of this application are intended to cover non-exclusive inclusion.

For example, a process, a method, a system, a product, or a device that includes a series of steps or units is not limited to the listed steps or units, but optionally further includes other unlisted steps or units, or optionally further includes another inherent step or unit of the process, the method, the product, or the device. It should be noted that, in the embodiments of this application, the word such as "example" or "for example" is used to represent providing an example, an illustration, or a description. Any embodiment or design scheme described as "example" or "for example" in the embodiments of this application should not be explained as being more preferred or having more advantages than another embodiment or design scheme. Exactly, use of the word such as "example" or "for example" is intended to present a related concept in a specific manner.

First, technical terms in the embodiments of this application are described as follows:

A photovoltaic module is a direct current power supply formed by connecting solar cells in serial/parallel. The solar cells can convert solar energy into electric energy.

A photovoltaic string is a direct current power supply formed by connecting a plurality of photovoltaic modules in series with positive and negative electrodes connected end to end.

Figure 1:
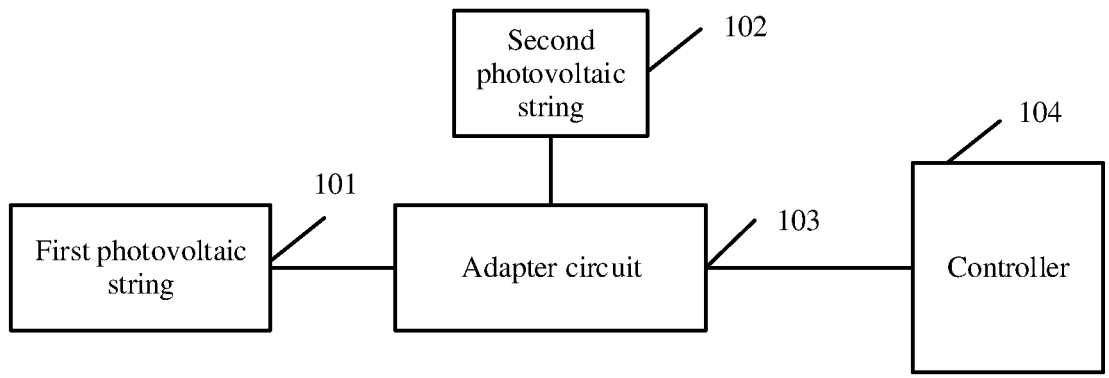
FIG. 1 is a schematic structural diagram of a photovoltaic system according to an embodiment of this application.

An embodiment of this application provides a photovoltaic system. Referring to FIG. 1, the photovoltaic system includes an adapter circuit 103, a first photovoltaic string 101, a second photovoltaic string 102, and a controller 104.

The first photovoltaic string 101 and the second photovoltaic string 102 are configured to provide electric energy for the controller 104.

The adapter circuit 103 is configured to be connected to the first photovoltaic string 101 in series. The adapter circuit 103 is further configured to connect the second photovoltaic string 102 to the first photovoltaic string 101 in series when a voltage of the first photovoltaic string 101 is lower than a preset threshold.

The controller 104 mentioned in this embodiment of this application may be an inverter, a combiner box, or another circuit, device, or the like having a direct current-alternating current conversion or string combination function. The description is applicable throughout the entire specification, and is not repeated below.

The first photovoltaic string 101 includes one or more photovoltaic modules.

The second photovoltaic string 102 includes one or more photovoltaic modules.

Optional, the adapter circuit 103 includes a communications circuit. The communications circuit is configured to implement communication between the adapter circuit 103 and another circuit. For example, the adapter circuit 103 receives a control instruction from the controller 104 by using the communications circuit. The control instruction is used to instruct the adapter circuit 103 to add the second string to the first string.

Optionally, the communications circuit may be a circuit based on a power line carrier (PLC), RS485, wireless fidelity (WI-FI), the zigbee protocol (zigbee), Lora, or an internet of things (JOT).

Optionally, a working mode of an output end of the adapter circuit 103 includes a cut-in mode, a cut-out mode, a maximum power point tracking (MPTT) mode, and a short-circuit mode. The cut-in mode means that when the voltage of the first string is lower than the preset threshold, the second string is connected to the first string. The cut-out mode means that when the voltage of the first string is relatively high, for example, the voltage of the first string exceeds the preset threshold, the adapter circuit 103 disconnects the first string from the controller 104. The MPTT mode means that the adapter circuit 103 can track a maximum power point and optimize output performance, to output maximum power. The short-circuit mode means that an output voltage of the adapter circuit 103 is 0.

Correspondingly, the controller 104 may also work in an MPPT mode.

The preset threshold includes a maximum allowable voltage of the photovoltaic system. The maximum allowable voltage is a lower voltage of a maximum input voltage of the controller 104 and a maximum output voltage of a photovoltaic string. There are two cases in which the voltage of the first photovoltaic string 101 is lower than the preset threshold. In a first case, that the voltage of the first photovoltaic string 101 is lower than the preset threshold means that an open-circuit voltage of the first photovoltaic string 101 is less than or equal to a first threshold. In a second case, that the voltage of the first photovoltaic string 101 is lower than the preset threshold means that a voltage to ground of the first photovoltaic string 101 is less than or equal to a second threshold. The first threshold and the second threshold may be determined depending on a specific use scenario, and are not limited in this embodiment of this application.

In this embodiment of this application, the voltage of the first photovoltaic string 101 may be detected by the adapter circuit 103, or may be detected by the controller 104. For example, the adapter circuit 103 detects the voltage of the first photovoltaic string 101. In a possible implementation, the adapter circuit 103 detects the open-circuit voltage of the first photovoltaic string 101, and when the open-circuit voltage is less than or equal to the first threshold, the adapter circuit 103 connects the second photovoltaic string 102 to the first photovoltaic string 101 in series. In another possible implementation, the adapter circuit 103 detects the voltage to ground of the first photovoltaic string 101, and when detecting that the voltage to ground of the first photovoltaic string 101 is less than or equal to the second threshold, the adapter circuit 103 connects the second photovoltaic string 102 to the first photovoltaic string 101.

In a possible implementation, corresponding to the two cases, the first photovoltaic string 101 and the adapter circuit 103 are connected in series in different manners.

In the first case, that the voltage of the first photovoltaic string 101 is lower than the preset threshold means that the open-circuit voltage of the first photovoltaic string 101 is less than or equal to the first threshold. Correspondingly, referring to FIG. 2, that the adapter circuit 103 is connected to the first photovoltaic string 101 in series may be that an input end of the adapter circuit 103 is connected to an output end of the first photovoltaic string 101. For example, in FIG. 2, the first photovoltaic string 101 includes four photovoltaic modules. That an input end of the adapter circuit 103 is connected to an output end of the first photovoltaic string 101 means that an output end, that is, an end e, of the entire first photovoltaic string 101 is connected to the input end of the adapter circuit 103. The output end of the adapter circuit 103 is connected to an input end of the controller 104.

Figure 3:
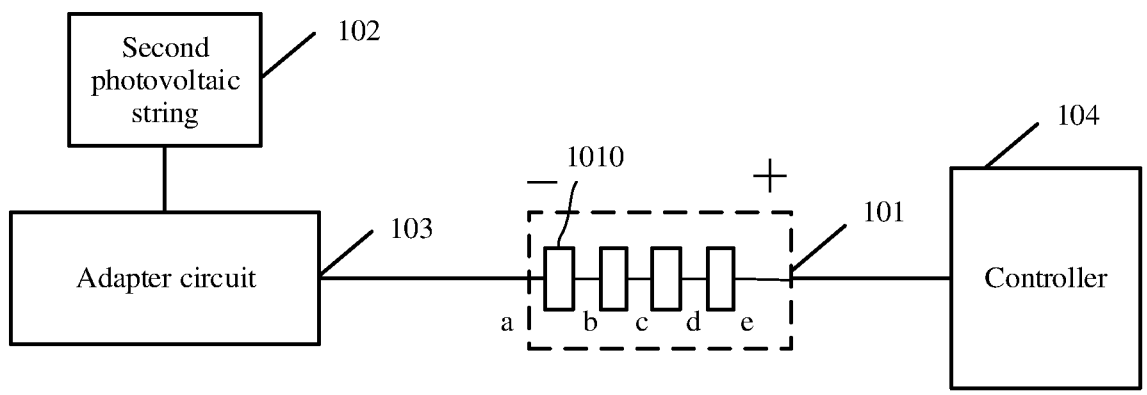
FIG. 3 is a schematic structural diagram of a photovoltaic system according to an embodiment of this application.

Alternatively, referring to FIG. 3, that the adapter circuit 103 is connected to the first photovoltaic string 101 in series may be that the output end of the adapter circuit 103 is connected to an input end of the first photovoltaic system. For example, the output end of the adapter circuit 103 is connected to an input end, that is, an end a, of the entire first photovoltaic string 101. An output end of the first photovoltaic string 101 is connected to an input end of the controller 104.

Figure 4:
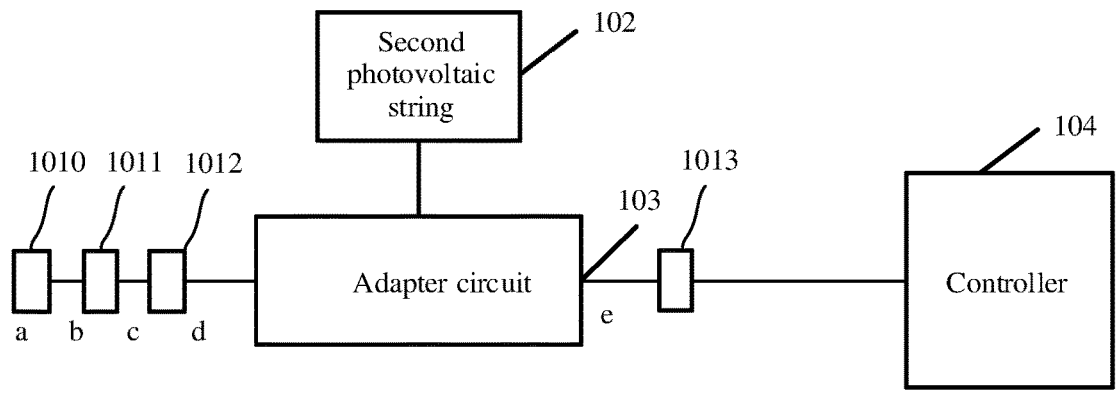
FIG. 4 is a schematic structural diagram of a photovoltaic system according to an embodiment of this application.

Alternatively, referring to FIG. 4, that the adapter circuit 103 is connected to the first photovoltaic string 101 in series may be that the adapter circuit 103 is connected between two adjacent photovoltaic modules of the first photovoltaic string 101 in series. To be specific, an input end of the adapter circuit 103 is connected to an output end of a front module of any two adjacent photovoltaic modules in the first photovoltaic string 101, and the output end of the adapter circuit 103 is connected to an input end of a rear module of the any two adjacent photovoltaic modules in the first photovoltaic string 101. For example, the input end of the adapter circuit 103 is connected to an output end of a photovoltaic module 1012, and the output end of the adapter circuit 103 is connected to an input end of a photovoltaic module 1013. An output end of the photovoltaic module 1013 in the first photovoltaic string 101 is connected to an input end of the controller 104. Certainly, the adapter circuit 103 may alternatively be connected between a photovoltaic module 1011 and the photovoltaic module 1012. A specific location of the adapter circuit 103 in the first photovoltaic string 101 is not limited in this embodiment of this application.

Figure 2:
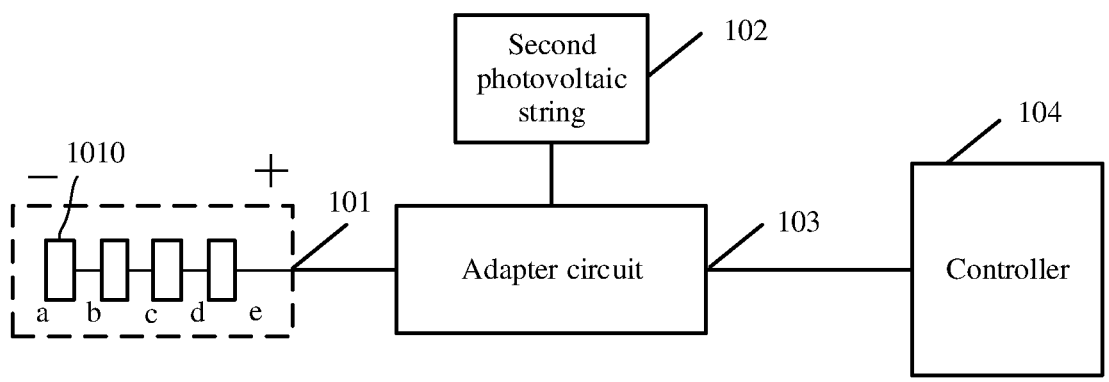
FIG. 2 is a schematic structural diagram of a photovoltaic system according to an embodiment of this application.

In the second case, in which that the voltage of the first photovoltaic string 101 is lower than the preset threshold means that the voltage to ground of the first photovoltaic string 101 is less than or equal to the second threshold, that the adapter circuit 103 is connected to the first photovoltaic string 101 in series may be in a connection manner shown in FIG. 2, which means that an input end of the adapter circuit 103 is connected to an output end of the entire first photovoltaic string 101; or may be in a connection manner shown in FIG. 3, which means that the output end of the adapter circuit 103 is connected to an input end of the entire first photovoltaic string 101.

In this embodiment of this application, a specific structure of the adapter circuit 103 may include the following two cases:

Case 1: The adapter circuit 103 includes a control circuit 1031, a first switch K1, and a first element 1032.

In case 1, if different manners are used for serial connection between the adapter circuit 103 and the first photovoltaic string 101, the photovoltaic system may have different specific structures. Three possible structures of the photovoltaic system provided in this embodiment of this application are as follows:

1. When the input end of the adapter circuit 103 is connected to the output end of the first photovoltaic string 101, referring to FIG. 5, a first end of the first element 1032 is connected to the output end of the first photovoltaic string 101, and a second end of the first element 1032 is connected to the input end of the controller 104. The first element 1032 is configured to connect the first photovoltaic string 101 to the controller 104 when the controller 104 is not powered on, and further configured to disable a path between the first photovoltaic string 101 and the controller 104 when the voltage of the first photovoltaic string 101 is lower than the preset threshold, and to disable the path between the first photovoltaic string 101 and the controller 104 when the voltage of the first photovoltaic string 101 exceeds the preset threshold.

A non-movable end of the first switch K1 is connected to the first end of the first element 1032 or an input end of the second photovoltaic string 102, a movable end of the first switch K1 is connected to the control circuit 1031, and the first switch K1 is configured to be opened or closed under control of the control circuit 1031, and connect the second photovoltaic string 102 to the first photovoltaic string 101 in a closed state. It should be noted that, when the controller 104 is not powered on, the first switch K1 is in an open-circuit state by default.

In this embodiment of this application, an open-circuit state and an open state of a switch are a same concept. The description is applicable throughout the entire specification, and is not repeated below.

The first switch K1 may be at least one of a mechanical switch, an electrical switch (for example, a switch of an electromagnetic relay type), and a power semiconductor (for example, an insulated gate bipolar transistor (IGBT) switch). Correspondingly, different types of control circuits 1031 may be selected based on a type of the first switch K1.

An output end of the second photovoltaic string 102 is connected to the second end of the first element 1032.

The control circuit 1031 is configured to: when the voltage of the first photovoltaic string 101 is lower than the preset threshold, control the first switch K1 to be closed.

Optionally, the first element 1032 is a diode D1.

Figure 5:
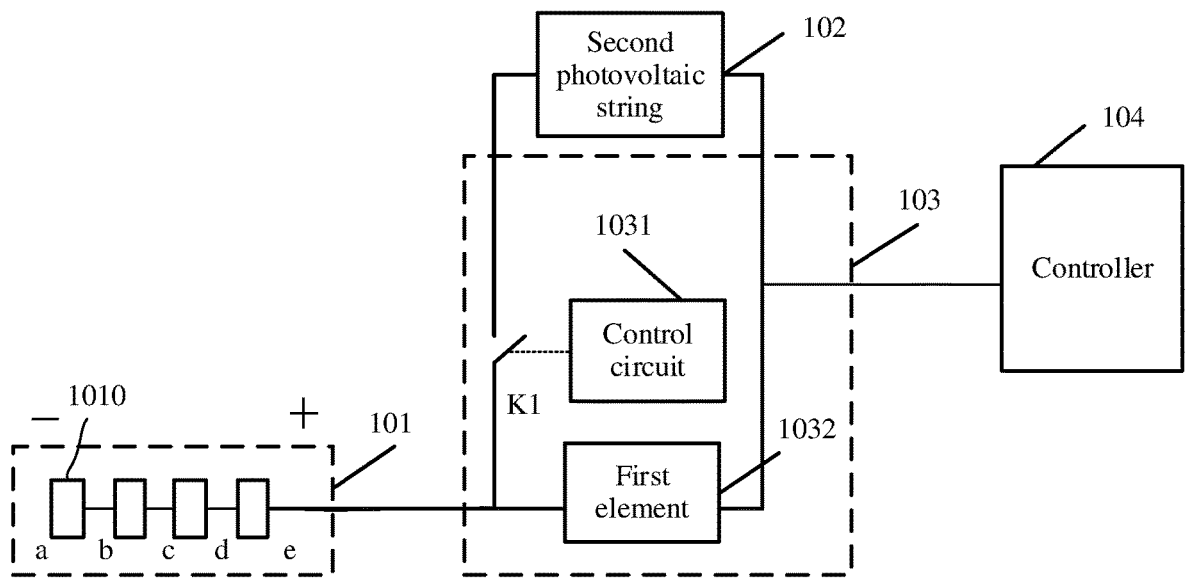
FIG. 5 is a schematic structural diagram of a photovoltaic system according to an embodiment of this application.
Figure 6:
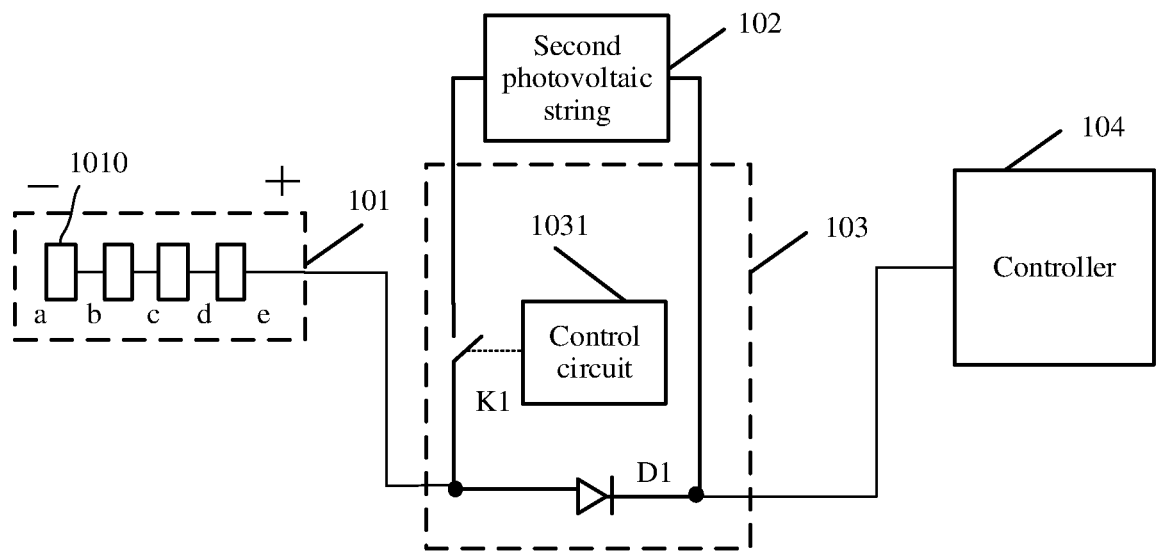
FIG. 6 is a schematic structural diagram of a photovoltaic system according to an embodiment of this application.

With reference to a connection manner shown in FIG. 5, referring to FIG. 6, when the first element 1032 is the diode D1, a positive electrode of the diode D1 is connected to the output end of the first photovoltaic string 101, and a negative electrode of the diode D1 is connected to the input end of the controller 104.

When the controller 104 is not powered on, the diode D1 is turned on to connect the first photovoltaic string 101 to the controller 104.

When the voltage of the first photovoltaic string 101 is lower than the preset threshold, the diode D1 is cut off, to disable a path connection between the first photovoltaic string 101 and the controller 104.

When the voltage of the first photovoltaic string 101 exceeds the preset threshold or the controller 104 is not powered on, the diode D1 is turned on. In this case, the path between the first photovoltaic string 101 and the controller 104 is formed.

Optionally, the first element 1032 may alternatively be a second switch K2.

Figure 7:
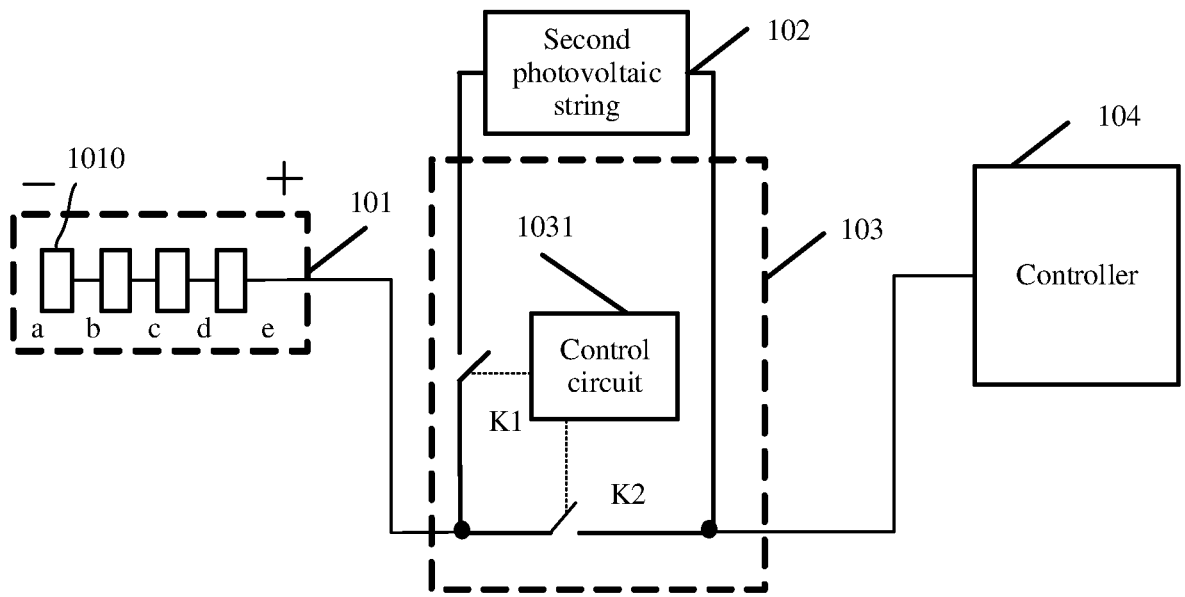
FIG. 7 is a schematic structural diagram of a photovoltaic system according to an embodiment of this application.

With reference to a connection manner shown in FIG. 5, referring to FIG. 7, when the first element 1032 is the second switch K2, a non-movable end of the second switch K2 is connected to the output end of the first photovoltaic string 101 or the input end of the controller 104, and a movable end of the second switch K2 is connected to the control circuit 1031. The second switch K2 is configured to be closed by default when the controller 104 is not powered on, to form the path between the first photovoltaic string 101 and the controller 104.

If the non-movable end of the second switch K2 is connected to the output end of the first photovoltaic string 101, the second switch K2 is configured to separate the movable end from the input end of the controller 104 when the voltage of the first photovoltaic string 101 is lower than the preset threshold, for example, when the voltage of the first photovoltaic string 101 is relatively low, to disable the path between the first photovoltaic string 101 and the controller 104. The second switch K2 is further configured to separate the movable end from the input end of the controller 104 when the voltage of the first photovoltaic string 101 exceeds the preset threshold, to disable the path between the first photovoltaic string 101 and the controller 104, to avoid excessively high power input to the controller 104.

If the non-movable end of the second switch K2 is connected to the input end of the controller 104, the second switch K2 is configured to separate the movable end of the second switch K2 from the output end of the first photovoltaic string 101 when the voltage of the first photovoltaic string 101 is lower than the preset threshold, or the voltage of the first photovoltaic string 101 exceeds the preset threshold, to disable the path between the first photovoltaic string 101 and the controller 104.

The second switch K2 may be at least one of a mechanical switch, an electrical switch (for example, a switch of an electromagnetic relay type), and a power semiconductor (for example, an insulated gate bipolar transistor (IGBT) switch). Correspondingly, different types of control circuits 1031 may be selected based on a type of the second switch K2.

2. When the output end of the adapter circuit 103 is connected to the input end of the first photovoltaic string 101, referring to FIG. 8, a structure of the photovoltaic system is as follows: A first end of the first element 1032 is connected to the first switch K1, and a second end of the first element 1032 is connected to the input end of the first photovoltaic string 101. The first element 1032 is configured to connect the first photovoltaic string 101 to the controller 104 when the controller 104 is not powered on, and further configured to disable a path between the first photovoltaic string 101 and the controller 104 when the voltage of the first photovoltaic string 101 is lower than the preset threshold or the voltage exceeds the preset threshold.

A non-movable end of the first switch K1 is connected to the first end of the first element 1032 or the input end of the second photovoltaic string 102, a movable end of the first switch K1 is connected to the control circuit 1031, and the first switch K1 is configured to be opened or closed under control of the control circuit 1031, and connect the second photovoltaic string 102 to the first photovoltaic string 101 in a closed state. When the controller 104 is not powered on, the first switch K1 is in an open state by default.

An output end of the second photovoltaic string 102 is connected to the second end of the first element 1032.

The control circuit 1031 is configured to: when the voltage of the first photovoltaic string 101 is lower than the preset threshold, control the first switch K1 to be closed.

The output end of the first photovoltaic string 101 is connected to the controller 104.

Figure 8:
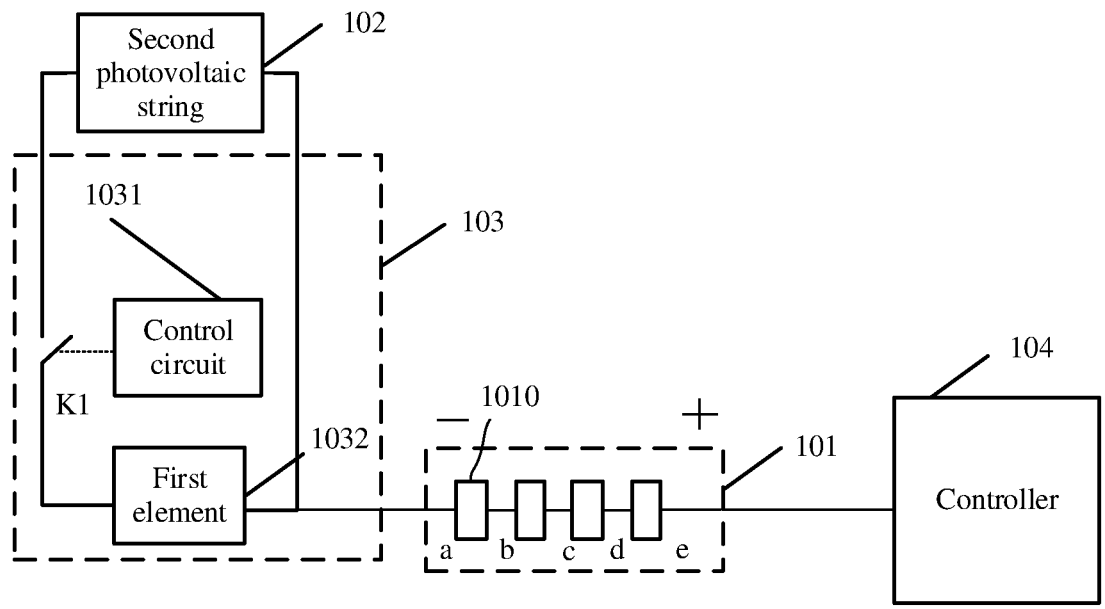
FIG. 8 is a schematic structural diagram of a photovoltaic system according to an embodiment of this application.
Figure 9:
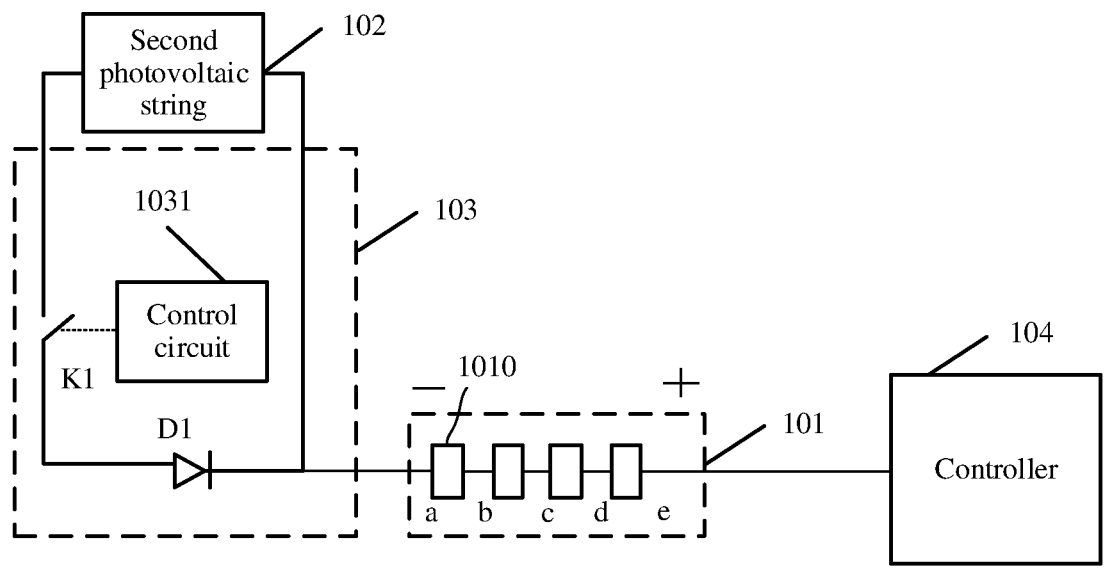
FIG. 9 is a schematic structural diagram of a photovoltaic system according to an embodiment of this application.

With reference to a connection manner shown in FIG. 8, referring to FIG. 9, when the first element 1032 is a diode D1, a positive electrode of the diode D1 is connected to the first switch K1, and a negative electrode of the diode D1 is connected to the input end of the first photovoltaic string 101. When the voltage of the first photovoltaic string 101 is lower than the preset threshold or the voltage exceeds the preset threshold, the diode D1 is cut off, to disable a path connection between the first photovoltaic string 101 and the controller 104. When the controller 104 is not powered on, the diode D1 is turned on. In this case, the path between the first photovoltaic string 101 and the controller 104 is formed.

Figure 10:
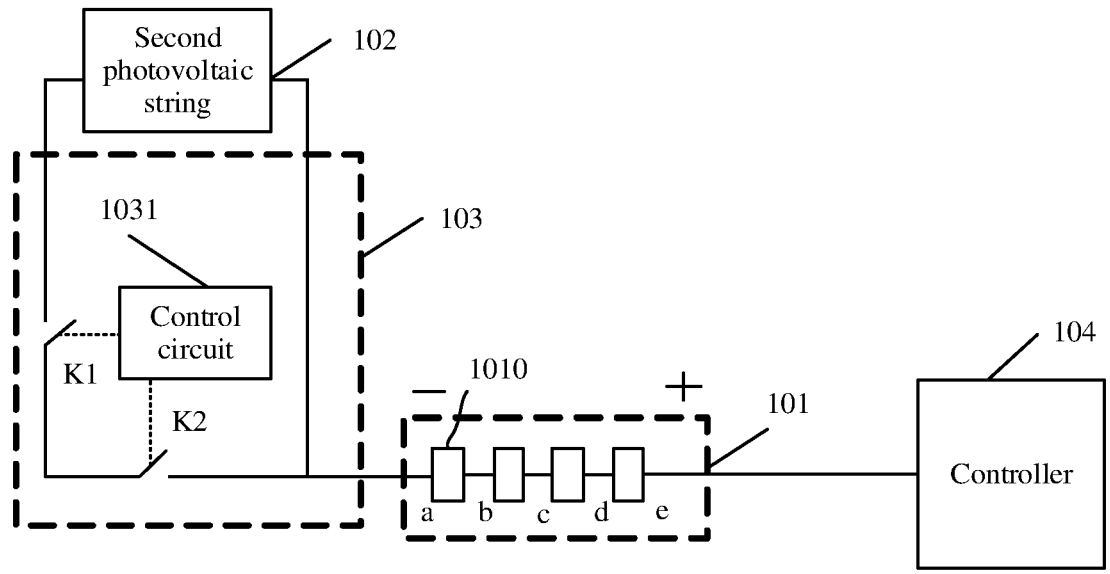
FIG. 10 is a schematic structural diagram of a photovoltaic system according to an embodiment of this application.

With reference to a connection manner shown in FIG. 8, referring to FIG. 10, when the first element 1032 is a second switch K2, a non-movable end of the second switch K2 is connected to the first switch K1 or the input end of the first photovoltaic string 101, and a movable end of the second switch K2 is connected to the control circuit 1031.

3. When the adapter circuit 103 is connected between two adjacent photovoltaic modules in the first photovoltaic string 101 in series, referring to FIG. 11, for example, a specific structure of the photovoltaic system may be as follows: A first end of the first element 1032 is connected to the output end of the photovoltaic module 1012 in the first photovoltaic string 101, and a second end of the first element 1032 is connected to the input end of the photovoltaic module 1013 in the first photovoltaic string 101. The first element 1032 is configured to connect the first photovoltaic string 101 to the controller 104 when the controller 104 is not powered on, and further configured to disable a path between the first photovoltaic string 101 and the controller 104 when the voltage of the first photovoltaic string 101 is lower than the preset threshold, and to disable the path between the first photovoltaic string 101 and the controller 104 when the voltage of the first photovoltaic string 101 exceeds the preset threshold.

A non-movable end of the first switch K1 is connected to the first end of the first element 1032 or an input end of the second photovoltaic string 102, a movable end of the first switch K1 is connected to the control circuit 1031, and the first switch K1 is configured to be opened or closed under control of the control circuit 1031, and connect the second photovoltaic string 102 to the first photovoltaic string 101 in a closed state.

An output end of the second photovoltaic string 102 is connected to the second end of the first element 1032.

The control circuit 1031 is configured to: when the voltage of the first photovoltaic string 101 is lower than the preset threshold, control the first switch K1 to be closed.

The output end of the photovoltaic module 1013 at a tail end of the first photovoltaic string 101 is connected to the controller 104.

Certainly, in the foregoing figures, that the adapter circuit 103 is connected between the photovoltaic module 1012 and the photovoltaic module 1013 in the first photovoltaic string 101 in series is merely used as an example. In actual application, the adapter circuit 103 may be connected between any two adjacent photovoltaic modules in the first photovoltaic string 101 in series.

Figure 11:
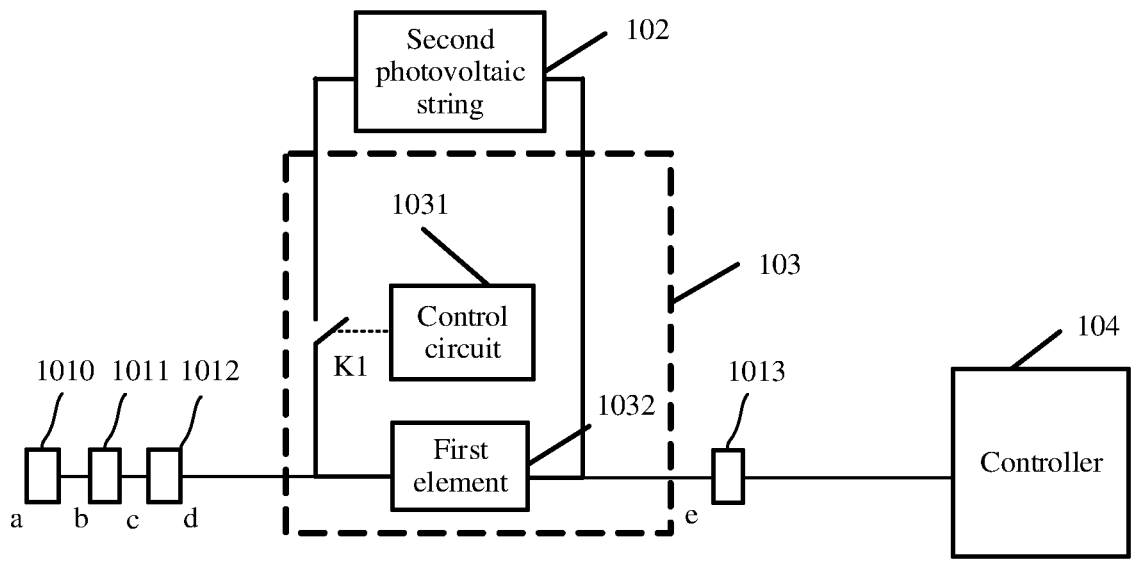
FIG. 11 is a schematic structural diagram of a photovoltaic system according to an embodiment of this application.
Figure 12:
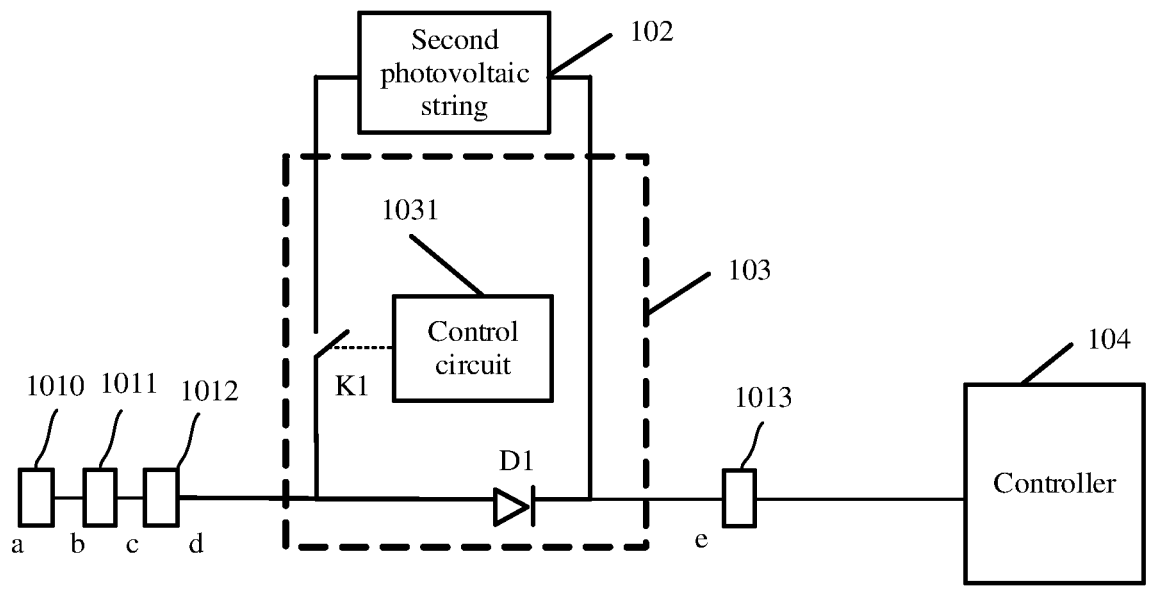
FIG. 12 is a schematic structural diagram of a photovoltaic system according to an embodiment of this application.

With reference to a connection manner shown in FIG. 11, referring to FIG. 12, for example, when the first element 1032 is a diode D1, a positive electrode of the diode D1 is connected to the output end of the photovoltaic module 1012 in the first photovoltaic string 101, and a negative electrode of the diode D1 is connected to the input end of the photovoltaic module 1013 in the first photovoltaic string 101. When the voltage of the first photovoltaic string 101 is lower than the preset threshold, the diode D1 is cut off, to disable a path connection between the first photovoltaic string 101 and the controller 104. When the voltage of the first photovoltaic string 101 exceeds the preset threshold, the diode D1 is cut off, to disable the path connection between the first photovoltaic string 101 and the controller 104. When the controller 104 is not powered on, the diode D1 is turned on. In this case, the path between the first photovoltaic string 101 and the controller 104 is formed.

Figure 13:
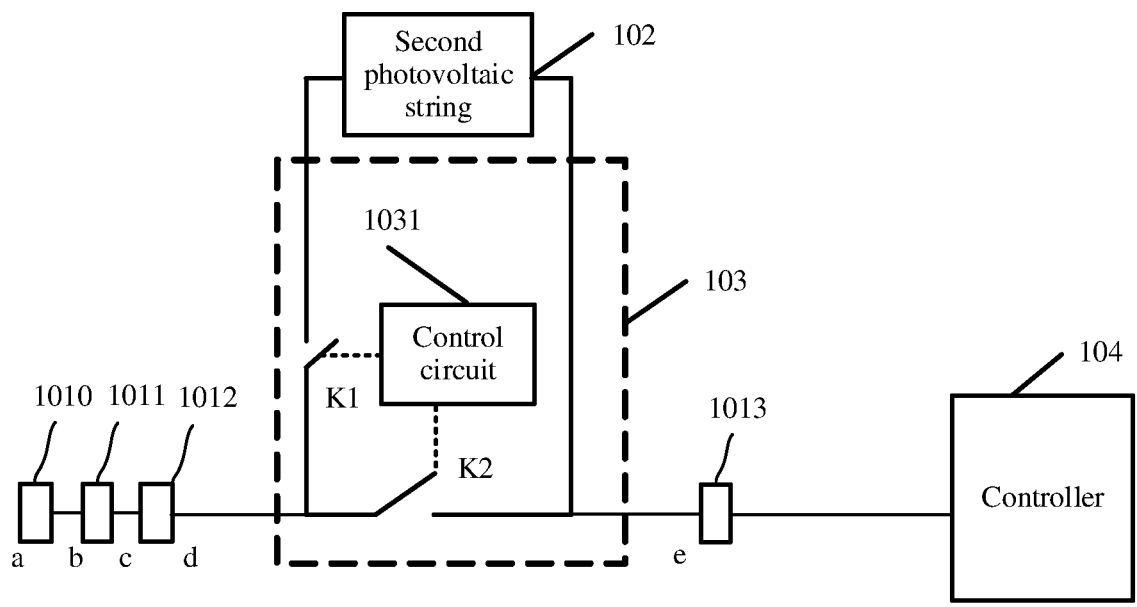
FIG. 13 is a schematic structural diagram of a photovoltaic system according to an embodiment of this application.

With reference to a connection manner shown in FIG. 11, referring to FIG. 13, when the first element 1032 is a second switch K2, a non-movable end of the second switch K2 is connected to the output end of the photovoltaic module 1012 in the first photovoltaic string 101 or the input end of the photovoltaic module 1013 in the first photovoltaic string 101, and a movable end of the second switch K2 is connected to the control circuit 1031.

Case 2: The adapter circuit 103 includes a control circuit 1031, a converter circuit 1033, and a second element 1034.

Similar to case 1, in case 2, if different manners are used for serial connection between the adapter circuit 103 and the first photovoltaic string 101, the photovoltaic system may also have different specific structures. Three possible structures of the photovoltaic system provided in this embodiment of this application are as follows:

1. When the input end of the adapter circuit 103 is connected to the output end of the first photovoltaic string 101, referring to FIG. 14, a first end of the second element 1034 is connected to the output end of the first photovoltaic string 101, and a second end of the second element 1034 is connected to the input end of the controller 104. The second element 1034 is configured to connect the first photovoltaic string 101 to the controller 104 when the controller 104 is not powered on, and further configured to disable a path between the first photovoltaic string 101 and the controller 104 when the voltage of the first photovoltaic string 101 is lower than the preset threshold or the voltage is greater than the preset threshold.

A first input end of the converter circuit 1033 is connected to an input end of the second photovoltaic string 102, a second input end of the converter circuit 1033 is connected to an output end of the second photovoltaic string 102, a first output end of the converter circuit 1033 is connected to the first end of the second element 1034, and a second output end of the converter circuit 1033 is connected to the second end of the second element 1034. The converter circuit 1033 is further connected to the control circuit 1031. The converter circuit 1033 is configured to connect the second photovoltaic string 102 to the first photovoltaic string 101 and output power to the controller 104 under control of the control circuit 1031. When the controller 104 is not powered on, an output voltage value between the first output end and the second output end of the converter circuit 1033 is 0 or a value less than a third threshold.

Optionally, the converter circuit 1033 may be a direct current-direct current (DC-DC) converter, or may be another circuit, device, or the like having a direct current-direct current conversion function.

For example, the converter circuit 1033 is a DC-DC converter. Optionally, an input end of the DC-DC converter works in an MPTT mode. In this way, the DC-DC converter can track a maximum power point and optimize output performance, to output maximum power.

Optionally, an output end of the DC/DC converter works in a constant voltage mode or an adjustable mode. The constant voltage mode means that an output voltage of the DC-DC converter is a fixed value. In this case, inputting a voltage of a fixed value to the controller 104 having a constant voltage input requirement can optimize output performance of the controller 104. The adjustable mode means that an output voltage of the DC-DC converter is not a fixed value.

Optionally, a scanning speed in the MPTT mode of the DC-DC converter is different from a scanning speed of the controller 104, to reduce interference to power.

Input power of the converter circuit 1033 is output power of the second photovoltaic string 102. The converter circuit 1033 converts, for example, steps up or down, the output power of the second photovoltaic string 102, to obtain output power between the first output end and the second output end of the converter circuit 1033. When the voltage of the first photovoltaic string 101 is lower than the preset threshold, the converter circuit 1033 connects the second photovoltaic string 102 to the first photovoltaic string 101, which means that the first photovoltaic string 101 and the second photovoltaic string 102 jointly output power to the controller 104. This means that power that is output by the converter circuit 1033 to the controller 104, that is, input power of the controller 104, is greater than output power of the first photovoltaic string 101.

The control circuit 1031 is configured to: when the voltage of the first photovoltaic string 101 is lower than the preset threshold, control output power of the converter circuit 1033. The control circuit 1031 is further configured to: when the controller 104 is not powered on, control the converter circuit 1033 to output a voltage 0 or output a voltage whose value is less than the third threshold.

Figure 14:
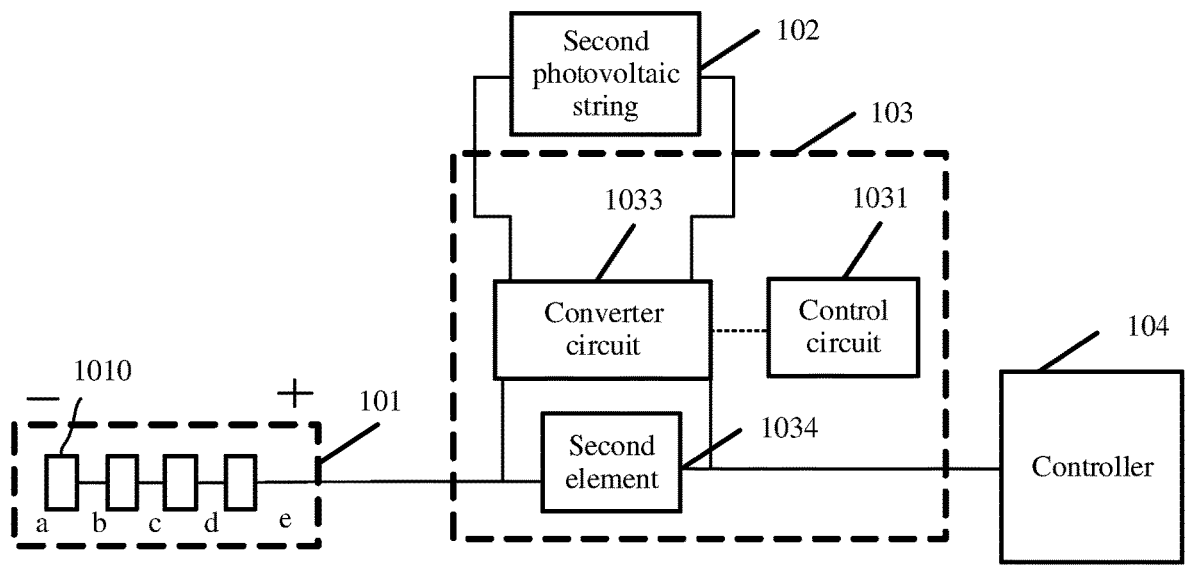
FIG. 14 is a schematic structural diagram of a photovoltaic system according to an embodiment of this application.
Figure 15:
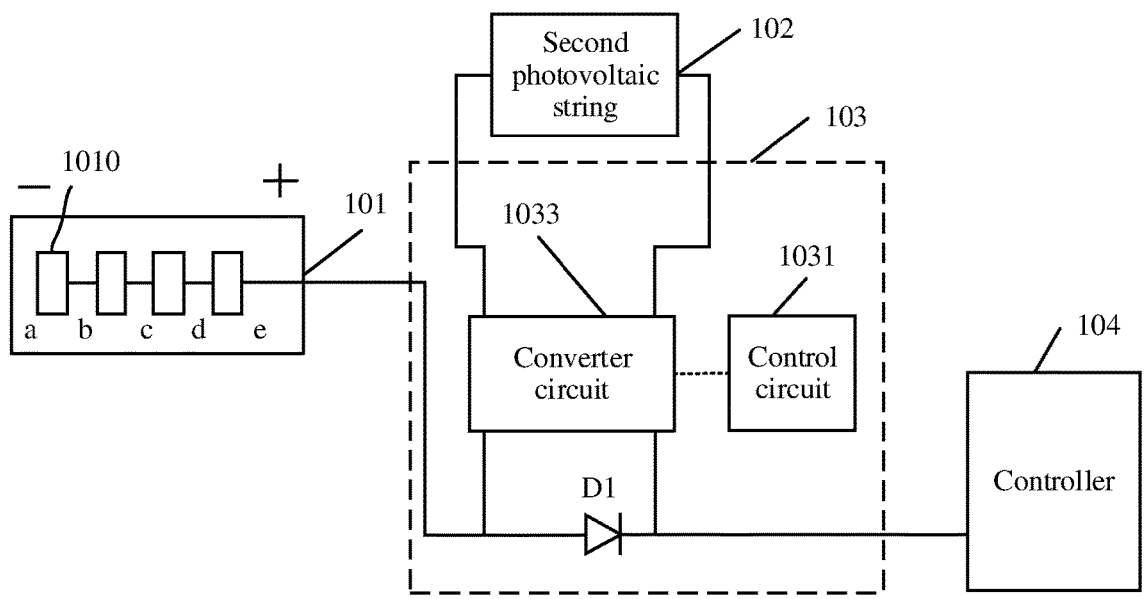
FIG. 15 is a schematic structural diagram of a photovoltaic system according to an embodiment of this application.

With reference to a connection manner shown in FIG. 14, referring to FIG. 15, when the second element 1034 is a diode D1, a positive electrode of the diode D1 is connected to the output end of the first photovoltaic string 101, and a negative electrode of the diode D1 is connected to the input end of the controller 104.

Figure 16:
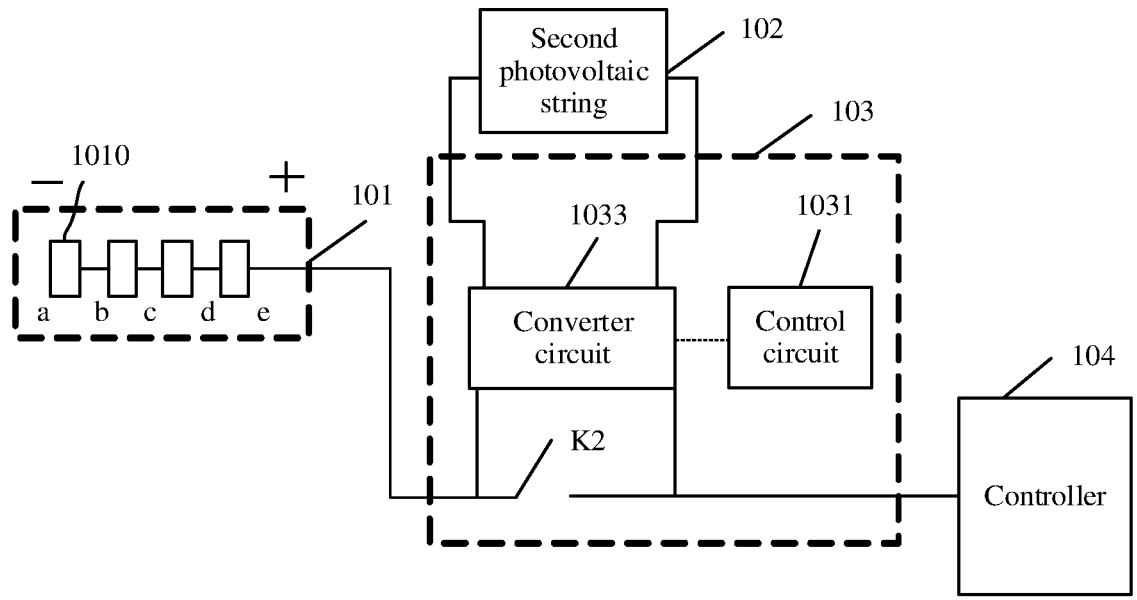
FIG. 16 is a schematic structural diagram of a photovoltaic system according to an embodiment of this application.

With reference to a connection manner shown in FIG. 14, referring to FIG. 16, when the second element 1034 is a second switch K2, a non-movable end of the second switch K2 is connected to the output end of the first photovoltaic string 101 or the input end of the controller 104, and a movable end of the second switch K2 is connected to the control circuit 1031.

2. When the output end of the adapter circuit 103 is connected to the input end of the first photovoltaic string 101, a difference between a structure of the photovoltaic system and that in FIG. 14 lies in that a connection manner between the second element 1034 and the first photovoltaic string 101 changes. Specifically, referring to FIG. 17, the second end of the second element 1034 is connected to the input end of the first photovoltaic string 101.

Figure 17:
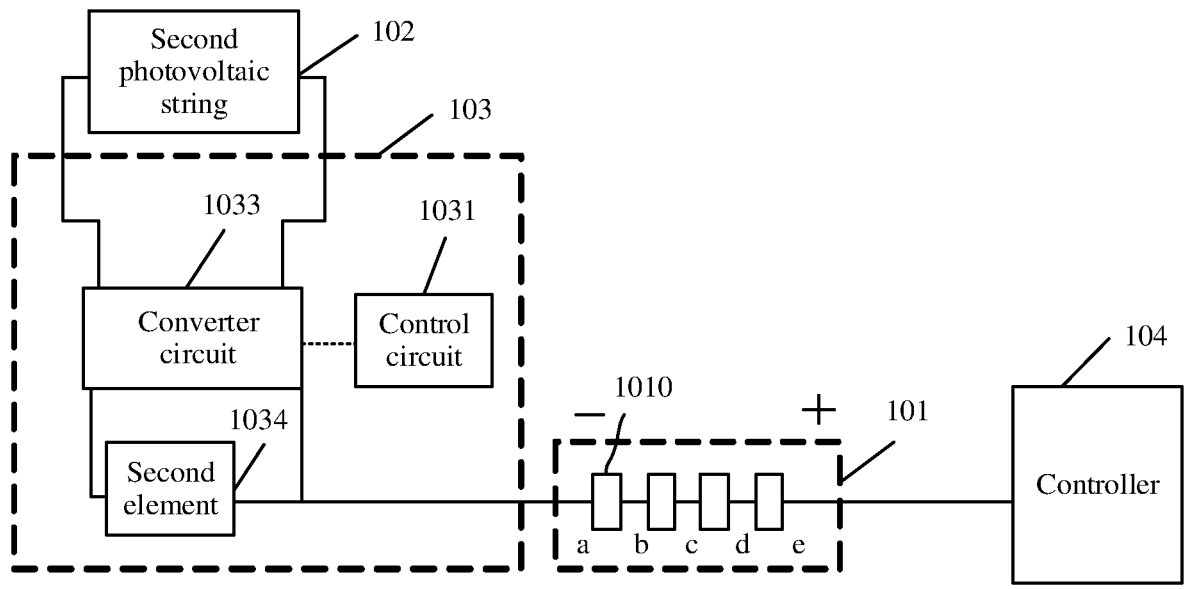
FIG. 17 is a schematic structural diagram of a photovoltaic system according to an embodiment of this application.
Figure 18:
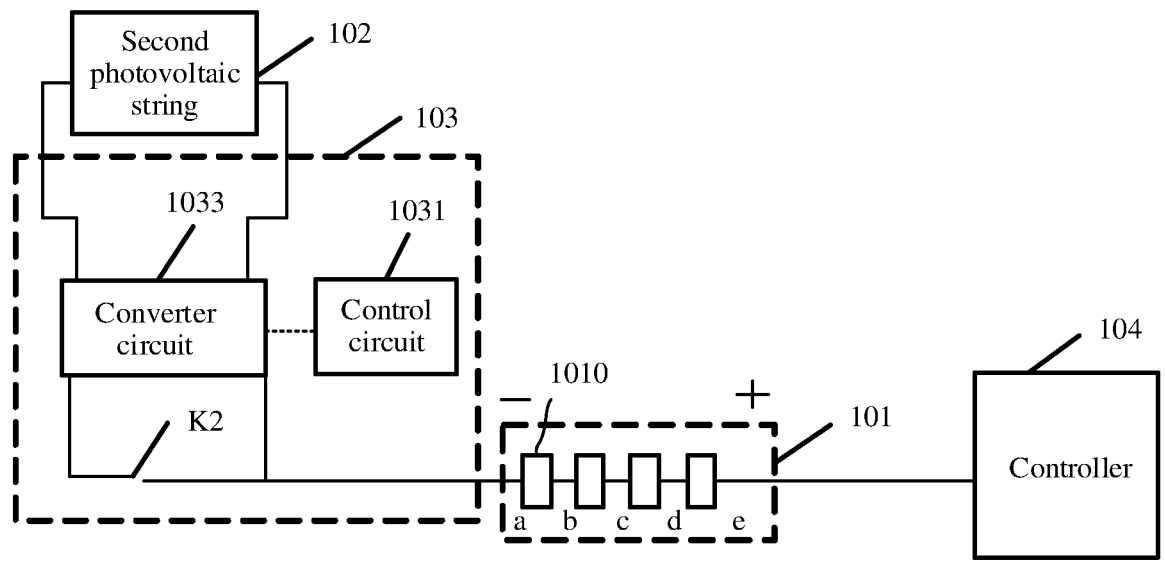
FIG. 18 is a schematic structural diagram of a photovoltaic system according to an embodiment of this application.

With reference to a connection manner shown in FIG. 17, referring to FIG. 18, when the second element 1034 is a second switch K2, a non-movable end of the second switch K2 is connected to the first input end of the converter circuit 1033 or the input end of the first photovoltaic string 101, and a movable end of the second switch K2 is connected to the control circuit 1031.

Figure 19:
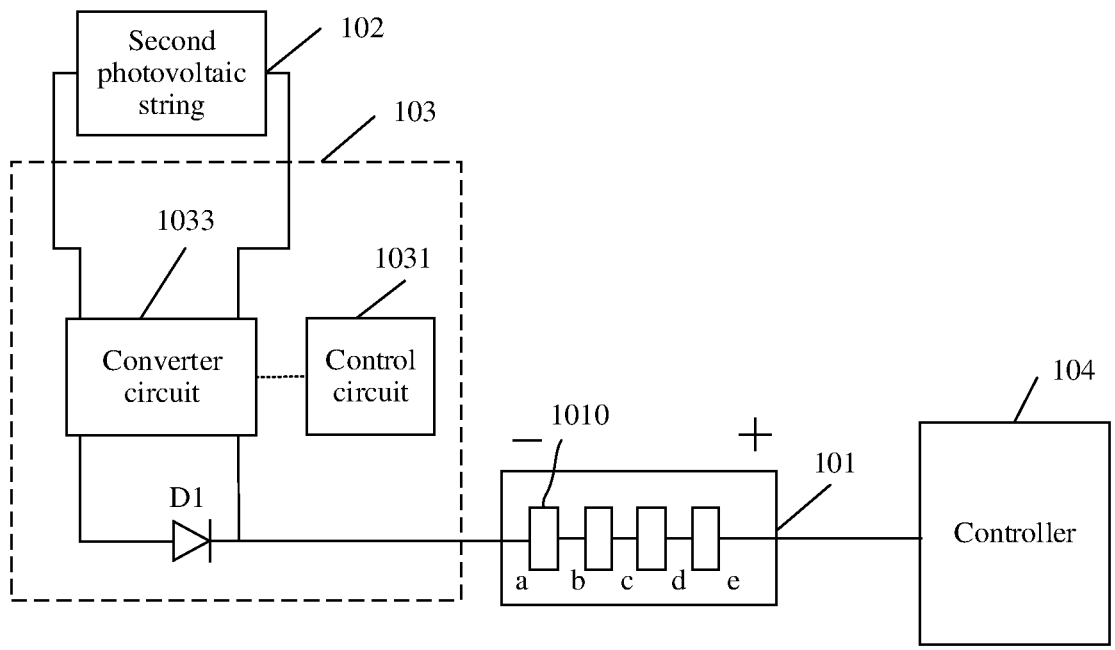
FIG. 19 is a schematic structural diagram of a photovoltaic system according to an embodiment of this application.

With reference to a connection manner shown in FIG. 17, referring to FIG. 19, when the second element 1034 is a diode D1, a positive electrode of the diode D1 is connected to the first output end of the converter circuit 1033, and a negative electrode of the diode D1 is connected to the input end of the first photovoltaic string 101.

3. When the adapter circuit 103 is connected between two adjacent photovoltaic modules in the first photovoltaic string 101 in series, a difference between a structure of the photovoltaic system and a structure of the photovoltaic system shown in FIG. 14 lies in that a connection manner between the second element 1034 and the first photovoltaic string 101 is different. Therefore, in this case, for a connection manner of another component in the photovoltaic system, refer to the embodiment corresponding to FIG. 14.

Figure 20:
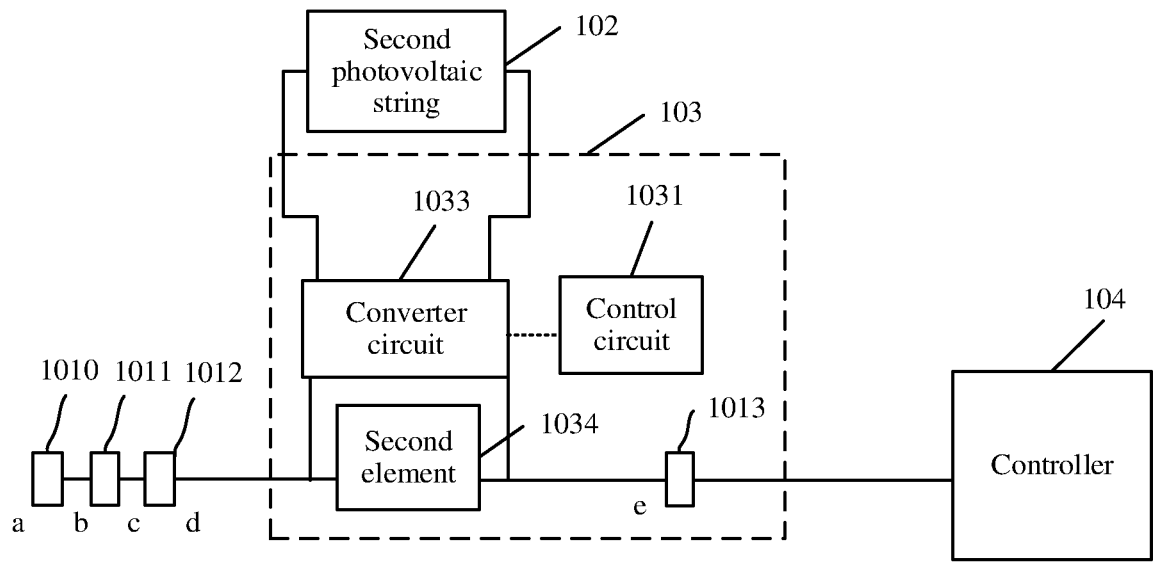
FIG. 20 is a schematic structural diagram of a photovoltaic system according to an embodiment of this application.

Referring to FIG. 20, for example, a first end of the second element 1034 is connected to the output end of the photovoltaic module 1012 in the first photovoltaic string 101, and a second end of the second element 1034 is connected to the input end of the photovoltaic module 1013 in the first photovoltaic string 101.

Figure 21:
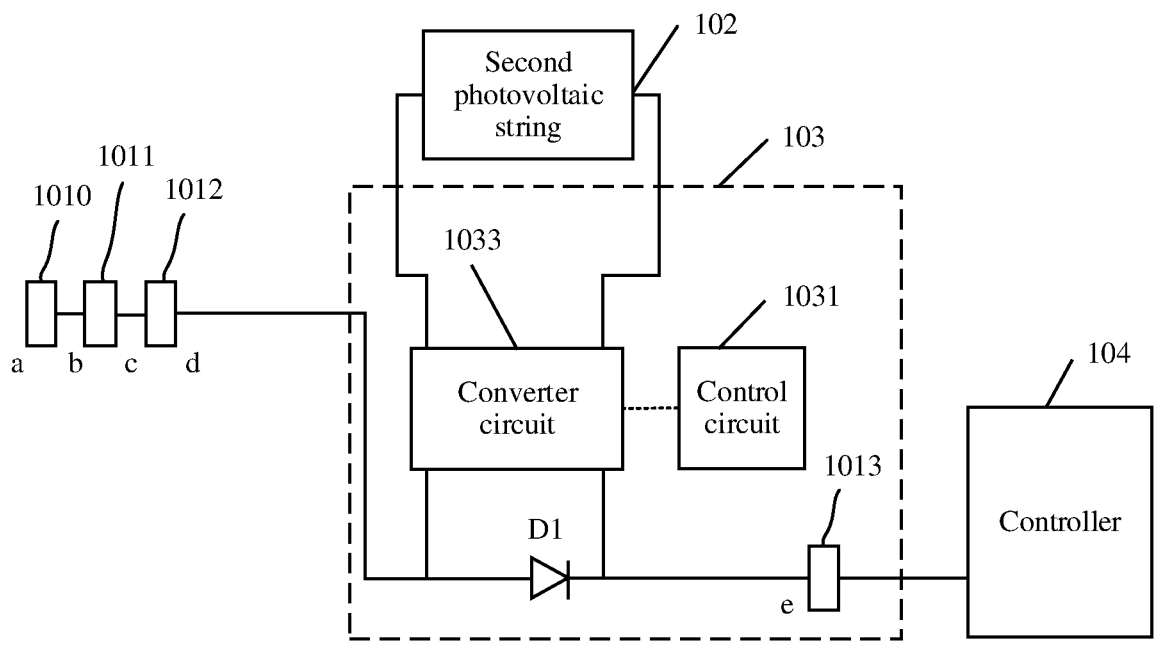
FIG. 21 is a schematic structural diagram of a photovoltaic system according to an embodiment of this application.

With reference to a connection manner shown in FIG. 20, referring to FIG. 21, for example, when the second element 1034 is a diode D1, a positive electrode of the diode D1 is connected to the output end of the photovoltaic module 1012 in the first photovoltaic string 101, and a negative electrode of the diode D1 is connected to the input end of the photovoltaic module 1013 in the first photovoltaic string 101.

Figure 22:
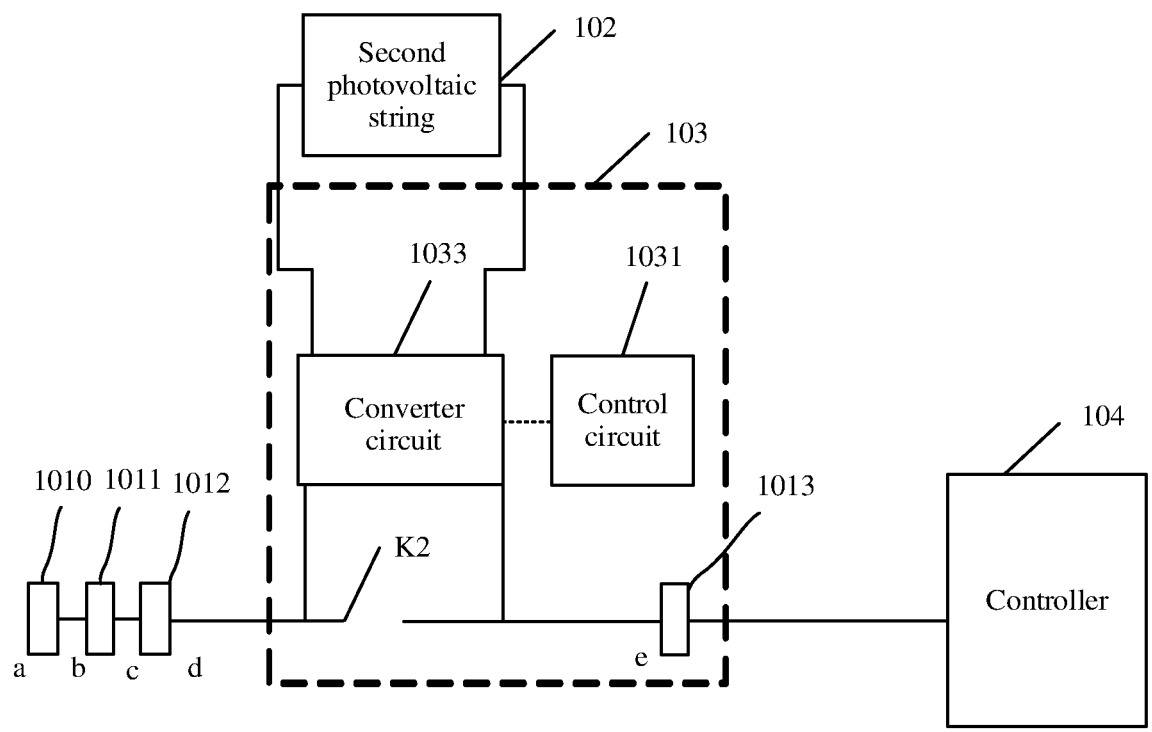
FIG. 22 is a schematic structural diagram of a photovoltaic system according to an embodiment of this application.

With reference to a connection manner shown in FIG. 20, referring to FIG. 22, when the second element 1034 is a second switch K2, a non-movable end of the second switch K2 is connected to the output end of the photovoltaic module 1012 in the first photovoltaic string 101 or the input end of the photovoltaic module 1013 in the first photovoltaic string 101, and a movable end of the second switch K2 is connected to the control circuit 1031.

Figure 25:
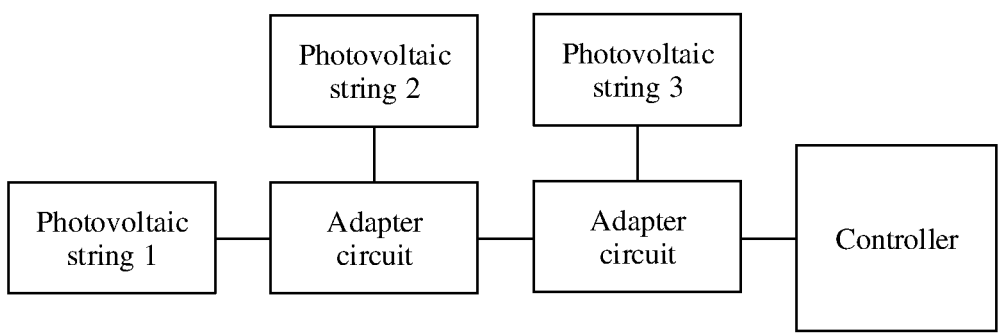
FIG. 25 is a schematic diagram of a connection manner of an adapter circuit in a photovoltaic system according to an embodiment of this application.
Figure 26:
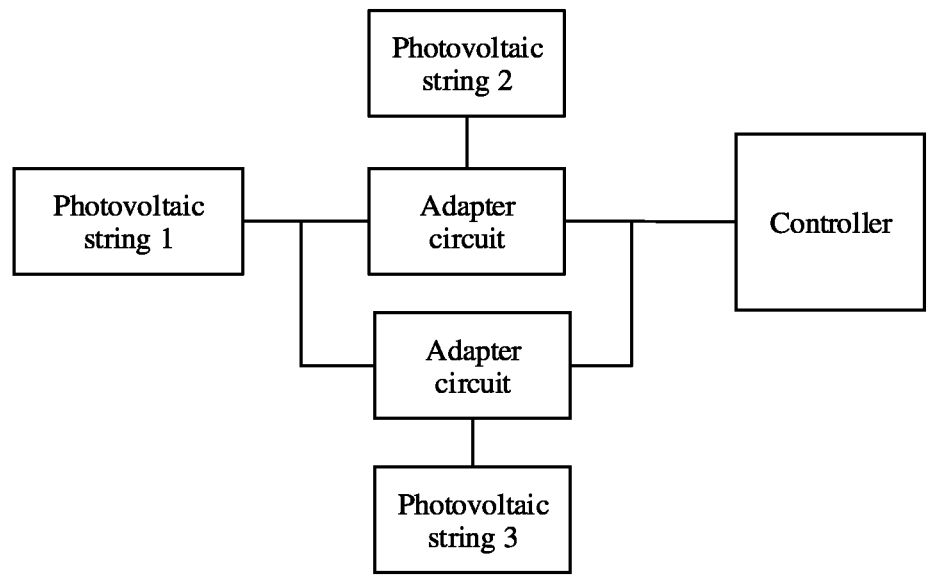
FIG. 26 is a schematic diagram of a connection manner of an adapter circuit in a photovoltaic system according to an embodiment of this application.
Figure 27:
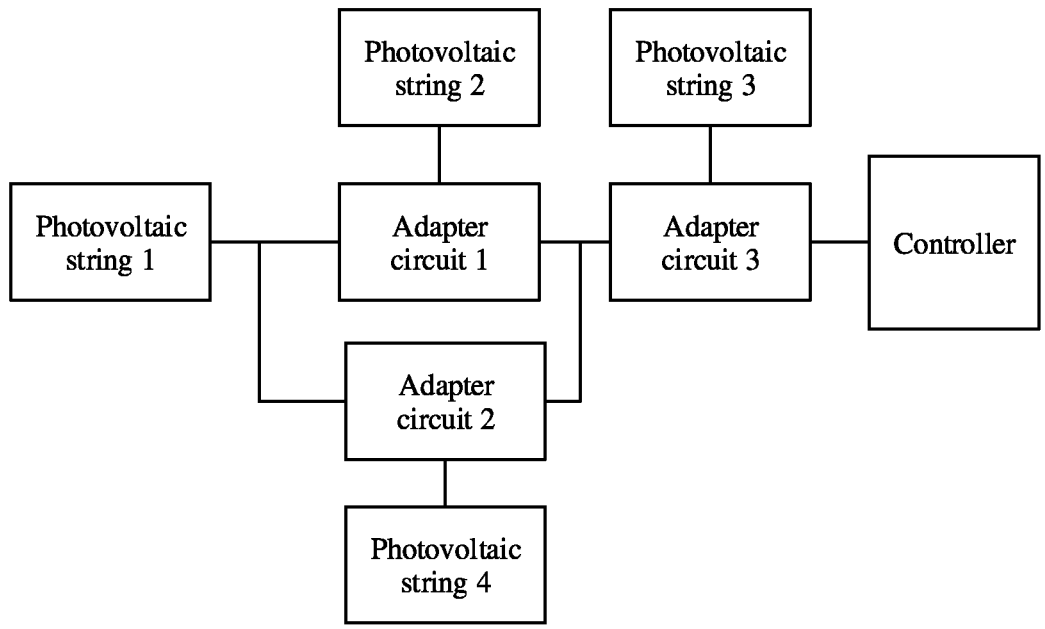
FIG. 27 is a schematic diagram of a connection manner of an adapter circuit in a photovoltaic system according to an embodiment of this application.

It should be noted that, for brevity of description, in the foregoing figures, that the photovoltaic system includes one adapter circuit and the adapter circuit controls connection of one string other than the first string is used as an example for description. In actual application, the photovoltaic system may alternatively include two or more adapter circuits, and each adapter circuit may connect one or more photovoltaic strings to a current photovoltaic string in series. The adapter circuits may be connected in series or in parallel. Each adapter circuit may control one or more strings to be connected to a connected string in series, so that strings that are connected in series and that include more photovoltaic modules are connected to the photovoltaic system. Referring to FIG. 25, two adapter circuits are connected in series. Referring to FIG. 26, two adapter circuits are connected in parallel. Referring to FIG. 27, an adapter circuit 1 and an adapter circuit 2 are connected in parallel, and the adapter circuit 1 and an adapter circuit 3 are connected in series.

Further, in addition to the components shown in the figure, the photovoltaic system may further have the following structure:

A switch (not shown in the figure) is disposed between the adapter circuit and the controller. The switch is configured to disable or enable a path between the adapter circuit and the controller. For example, referring to FIG. 12, a switch may be disposed between the output end of the photovoltaic module 1013 and the controller. Alternatively, a switch is disposed between the second end of the diode and the input end of the photovoltaic module 1013. For another example, referring to FIG. 6, a switch is disposed between the output end of the first string and the positive electrode of the diode. A specific location of the switch may be flexibly determined depending on an application scenario. This is not limited herein.

The photovoltaic system provided in this embodiment of this application includes the adapter circuit, the first photovoltaic string, the second photovoltaic string, and the controller. The first photovoltaic string and the second photovoltaic string are configured to provide electric energy for the controller. The adapter circuit is configured to be connected to the first photovoltaic string in series, and configured to connect the second photovoltaic string to the first photovoltaic string in series when the voltage of the first photovoltaic string is lower than the preset threshold. In this way, connecting the second photovoltaic string to the first photovoltaic string means that a quantity of photovoltaic strings that are connected to the photovoltaic system and that output power to the controller increases, so that a working voltage of an overall photovoltaic string can be increased, thereby increasing an electric energy yield. In addition, one adapter circuit may control the second photovoltaic string to be connected to the first photovoltaic string, which means that one adapter circuit may control a plurality of photovoltaic modules to be connected to the photovoltaic system in series. Therefore, there is no need to separately configure a connection control circuit for each photovoltaic module, thereby simplifying the structure of the photovoltaic system.

Figure 23:
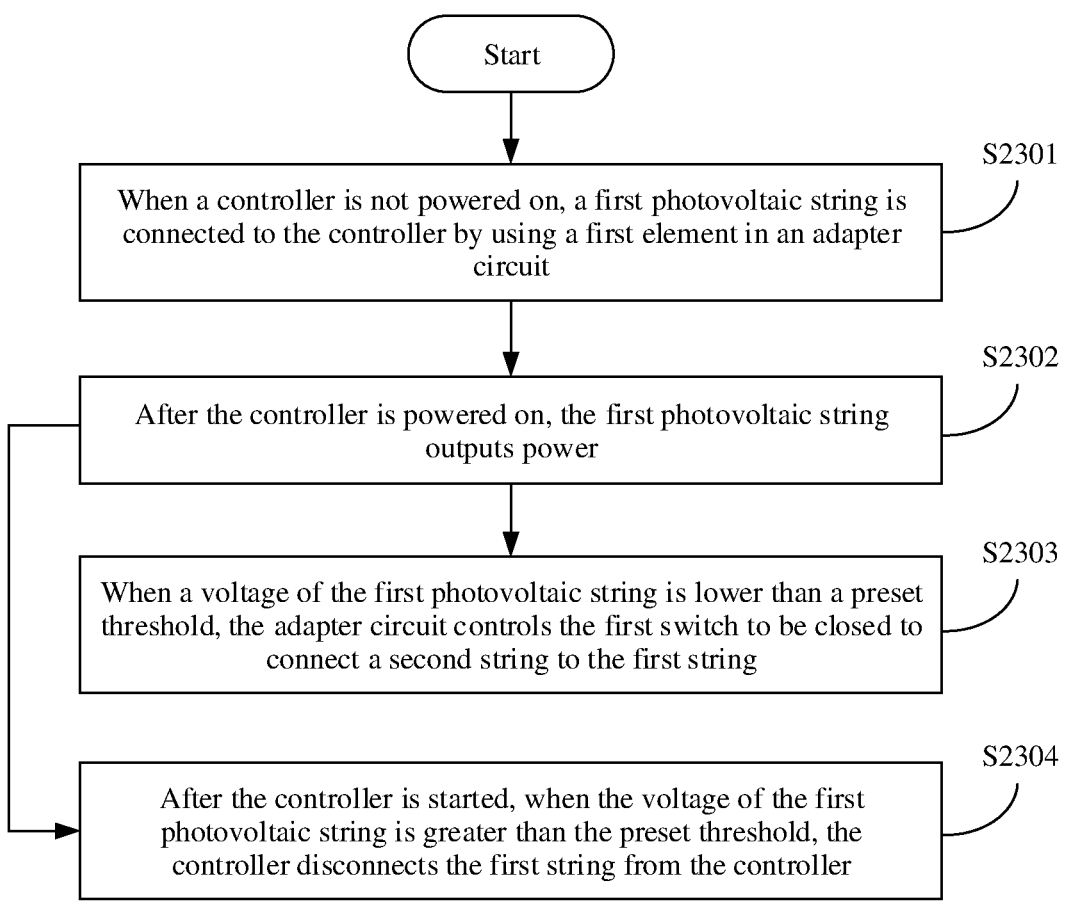
FIG. 23 is a schematic diagram of a working process of a photovoltaic system according to an embodiment of this application.

With reference to the embodiments corresponding to FIG. 5 to FIG. 13, referring to FIG. 23, a working process of the photovoltaic system includes the following steps.

S2301. When the controller is not powered on, the first photovoltaic string is connected to the controller by using the first element in the adapter circuit.

In this case, a string connected to the controller is the first photovoltaic string, and input power of the controller is equal to output power of the first photovoltaic string.

S2302. After the controller is powered on, the first photovoltaic string outputs power.

It can be learned from an output characteristic of a photovoltaic string that, in a process of outputting power by the first photovoltaic string, as a current increases, a voltage at two ends of the first photovoltaic string tends to decrease.

S2303. When the voltage of the first photovoltaic string is lower than the preset threshold, the adapter circuit controls the first switch to be closed to connect the second string to the first string.

A preset condition includes at least one of the following: The open-circuit voltage of the first photovoltaic string is less than or equal to the first threshold. The voltage to ground of the first photovoltaic string is less than or equal to the second threshold.

The voltage of the first photovoltaic string may be detected by the controller, or a voltage detection procedure may be performed by the adapter circuit.

Optionally, if the controller detects the open-circuit voltage or the voltage to ground of the first photovoltaic string, when detecting that the voltage to ground or the open-circuit voltage of the first photovoltaic string is lower than the preset threshold, the controller sends a control instruction to the adapter circuit, to notify the adapter circuit that the voltage of the first string is lower than the preset threshold.

Optionally, after receiving the control instruction from the controller, the adapter circuit controls a quantity of connected strings according to a voltage control policy determined by the adapter circuit. For example, when the voltage to ground of the first photovoltaic string is relatively low, the adapter circuit determines, based on the voltage control policy of the adapter circuit, whether a voltage of all strings exceeds the preset threshold of the photovoltaic system after connection of another string. If the voltage of all the strings exceeds the preset threshold, the adapter circuit does not connect the another string to the first photovoltaic string. If the voltage of all the strings does not exceed the preset threshold after connection of the another string, the adapter circuit controls the another string to be connected to the first photovoltaic string. Certainly, the voltage control policy may alternatively be determined by the controller and sent to the adapter circuit. The voltage control policy includes, but is not limited to, determining whether another string other than the first photovoltaic string needs to be connected to the photovoltaic system and a quantity of other strings that need to be connected to the photovoltaic system.

Optional, the voltage of the first photovoltaic string may alternatively be detected by the adapter circuit.

In this case, the photovoltaic string connected to the controller includes the first photovoltaic string and the second photovoltaic string. Correspondingly, the input power of the controller is equal to a sum of output power of the first photovoltaic string and output power of the second photovoltaic string.

S2304. After the controller is started, when the voltage of the first photovoltaic string is greater than the preset threshold, the controller disconnects the first string from the controller.

The first element may be controlled by using the adapter circuit to disconnect the first string from the controller. Alternatively, another switch between the adapter circuit and the controller may be switched off to disconnect the first string from the controller. This is not limited herein. Optional, the first string may be connected to the controller by using the second element.

Figure 24:
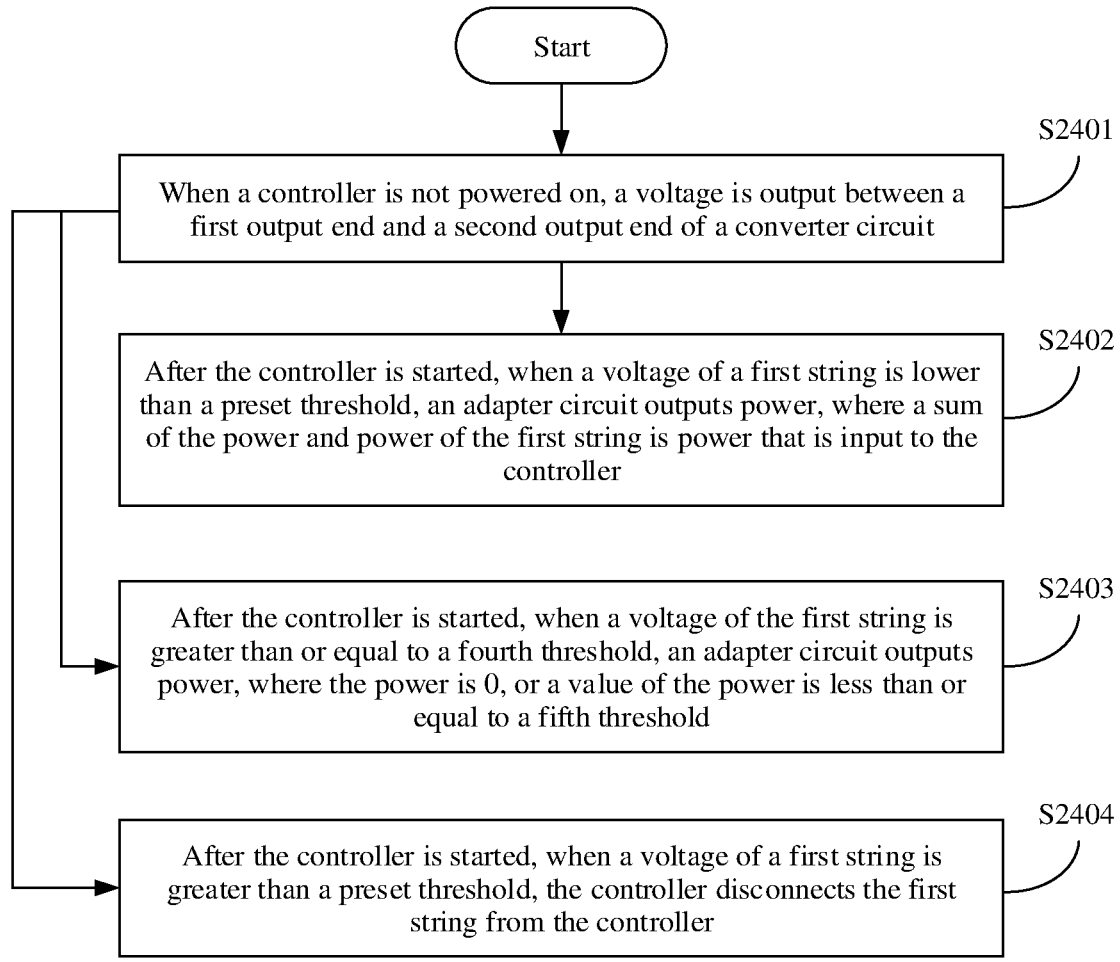
FIG. 24 is a schematic diagram of a working process of a photovoltaic system according to an embodiment of this application.

With reference to the embodiments corresponding to FIG. 14 to FIG. 22, referring to FIG. 24, if a part configured to control connection of the second string is a converter circuit, a working process of the photovoltaic system may include the following steps.

S2401. When the controller is not powered on, a voltage is output between the first output end and the second output end of the converter circuit, where a voltage that is output by the adapter circuit is 0 or a value less than the third threshold.

Because the voltage that is output by the adapter circuit has a relatively low value, a sum of the relatively low voltage value and the voltage of the first string does not exceed the preset threshold of the photovoltaic system.

S2402. After the controller is started, when the voltage of the first string is lower than the preset threshold, the adapter circuit outputs power, where a sum of the power and power of the first string is power that is input to the controller.

S2403. After the controller is started, when the voltage of the first string is greater than or equal to a fourth threshold, the adapter circuit output power, where the power is 0, or a value of the power is less than or equal to a fifth threshold.

In this way, when the voltage of the first string is relatively high, the adapter circuit limits output power of the adapter circuit to prevent the voltage of the string connected to the photovoltaic system from exceeding the preset threshold.

S2404. After the controller is started, when the voltage of the first string is greater than the preset threshold, the controller disconnects the first string from the controller. Optional, the first string may be connected to the controller by using the second element.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A photovoltaic system comprising:
an adapter circuit,
a first photovoltaic string,
a second photovoltaic string, and
a controller, wherein:
the controller comprises an inverter or a combiner box;
the first photovoltaic string and the second photovoltaic string are configured to provide electric energy for the controller; and
the adapter circuit is configured to be connected to the first photovoltaic string in series, and further configured to connect the second photovoltaic string to the first photovoltaic string in series when a voltage of the first photovoltaic string is lower than the preset threshold,
wherein the adapter circuit comprises a control circuit, a first switch, and a first element, a non-movable end of the first switch is connected to a first end of the first element or an input end of the second photovoltaic string, a movable end of the first switch is connected to the control circuit, the first switch is configured to be opened or closed under control of the control circuit, and connect the second photovoltaic string to the first photovoltaic string in series in a closed state, and when the controller is not powered on, the first switch is in an open-circuit state by default,
wherein the first end of the first element is connected to an output end of the first photovoltaic string, a second end of the first element is connected to an input end of the controller, and the first element is configured to connect the first photovoltaic string to the controller under the control of the control circuit when the controller is not powered on, and further configured to disable a path between the first photovoltaic string and the controller under the control of the control circuit when the voltage of the first photovoltaic string exceeds the preset threshold;
an output end of the second photovoltaic string is connected to an output end of the first element; and
the control circuit is configured to: when the voltage of the first photovoltaic string is lower than the preset threshold, control the first switch to be closed.

2. The photovoltaic system according to claim 1, wherein the first element is a diode, a positive electrode of the diode is connected to the output end of the first photovoltaic string, and a negative electrode of the diode is connected to the input end of the controller.

3. The photovoltaic system according to claim 1, wherein the first element is a second switch, a non-movable end of the second switch is connected to the output end of the first photovoltaic string or the input end of the controller, and a movable end of the second switch is connected to the control circuit.

4. The photovoltaic system according to claim 1, wherein a first end of the first element is connected to a first switch, a second end of the first element is connected to an input end of the first photovoltaic string, and the first element is configured to connect the first photovoltaic string to the controller when the controller is not powered on, and further configured to disable a path between the first photovoltaic string and the controller the first photovoltaic string exceeds the preset threshold; and
a non-movable end of the first switch is connected to the first end of the first element or an input end of the second photovoltaic string, a movable end of the first switch is connected to a control circuit, the first switch is configured to be opened or closed under control of the control circuit, and connect the second photovoltaic string to the first photovoltaic string in a closed state, and when the controller is not powered on, the first switch is in an open state by default;
an output end of the second photovoltaic string is connected to the second end of the first element;
the control circuit is configured to: when the voltage of the first photovoltaic string is lower than a preset threshold, control the first switch to be closed; and
an output end of the first photovoltaic string is connected to the controller.

5. The photovoltaic system according to claim 4, wherein the first element is a diode, a positive electrode of the diode is connected to the first switch, and a negative electrode of the diode is connected to the input end of the first photovoltaic string.

6. The photovoltaic system according to claim 4, wherein the first element is a second switch, a non-movable end of the second switch is connected to the first switch or the input end of the first photovoltaic string, and a movable end of the second switch is connected to the control circuit.

7. The photovoltaic system according to claim 1, wherein a first end of a first element is connected to an output end of a first photovoltaic module in the first photovoltaic string, a second end of the first element is connected to an input end of a second photovoltaic module in the first photovoltaic string, and the first element is configured to connect the first photovoltaic string to the controller when the controller is not powered on, and further configured to disable a path between the first photovoltaic string and the controller when the voltage of the first photovoltaic string exceeds the preset threshold, wherein the first photovoltaic module is a front photovoltaic module of two adjacent photovoltaic modules in the first photovoltaic string, and the second photovoltaic module is a latter photovoltaic module of the two adjacent photovoltaic modules in the first photovoltaic string;

- a non-movable end of a first switch is connected to the first end of the first element or an input end of the second photovoltaic string, a movable end of the first switch is connected to a control circuit, and the first switch is configured to be opened or closed under control of the control circuit, and connect the second photovoltaic string to the first photovoltaic string in a closed state; and
- an output end of the second photovoltaic string is connected to the second end of the first element;
- the control circuit is configured to: when the voltage of the first photovoltaic string is lower than a preset threshold, control the first switch to be closed; and
- an output end of a photovoltaic module located at a tail end of the first photovoltaic string is connected to an input end of the controller.

8. The photovoltaic system according to claim 7, wherein the first element is a diode, a positive electrode of the diode is connected to the output end of the first photovoltaic module, and a negative electrode of the diode is connected to the input end of the second photovoltaic module.

9. The photovoltaic system according to claim 7, wherein the first element is a second switch, a non-movable end of the second switch is connected to the output end of the first photovoltaic module or the input end of the second photovoltaic module, and a movable end of the second switch is connected to the control circuit.

10. The photovoltaic system according to claim 1, wherein a second end of a first element is connected to an input end of the first photovoltaic string, and the first element is configured to connect the first photovoltaic string to the controller under the control of the control circuit when the controller is not powered on, and further configured to disable a path between the first photovoltaic string and the controller under the control of the control circuit when the voltage of the first photovoltaic string is greater than or equal to the preset threshold;

- a first input end of a converter circuit is connected to an input end of the second photovoltaic string, a second input end of the converter circuit is connected to an output end of the second photovoltaic string, a first output end of the converter circuit is connected to a first end of the first element, a second output end of the converter circuit is connected to the second end of the first element, the converter circuit is further connected to a control circuit, and the converter circuit is configured to connect the second photovoltaic string to the first photovoltaic string under control of the control circuit; and when the controller is not powered on, an output voltage value between the first output end and the second output end of the converter circuit is 0 or a value less than another threshold;
- the control circuit is configured to: when the voltage of the first photovoltaic string is lower than the preset threshold, control the converter circuit to connect the second photovoltaic string to the first photovoltaic string; and
- an output end of the first photovoltaic string is connected to an input end of the controller.

11. The photovoltaic system according to claim 10, wherein the first element is a second switch, a non-movable end of the second switch is connected to the first input end of the converter circuit or the input end of the first photovoltaic string, and a movable end of the second switch is connected to the control circuit.

12. The photovoltaic system according to claim 10, wherein the first element is a diode, a positive electrode of the diode is connected to the first output end of the converter circuit, and a negative electrode of the diode is connected to the input end of the first photovoltaic string.

13. The photovoltaic system according to claim 1, wherein a first end of a first element is connected to an output end of a first photovoltaic module, a second end of the first element is connected to an input end of a second photovoltaic module, and the first element is configured to connect the first photovoltaic string to the controller when the controller is not powered on, and further configured to disable a path between the first photovoltaic string and the controller when the voltage of the first photovoltaic string is greater than the preset threshold, wherein the first photovoltaic module is a front photovoltaic module of two adjacent photovoltaic modules in the first photovoltaic string, and the second photovoltaic module is a latter photovoltaic module of the two adjacent photovoltaic modules in the first photovoltaic string;

- a first input end of a converter circuit is connected to an input end of the second photovoltaic string, a second input end of the converter circuit is connected to an output end of the second photovoltaic string, a first output end of the converter circuit is connected to the first end of the first element, a second output end of the converter circuit is connected to the second end of the first element, the converter circuit is further connected to a control circuit, and the converter circuit is configured to connect the second photovoltaic string to the first photovoltaic string under control of the control circuit, and further configured to output a first voltage value under control of the control circuit, wherein the first voltage value is 0 or lower than another threshold; and
- the control circuit is configured to: when the voltage of the first photovoltaic string is lower than the preset threshold, control the converter circuit to connect the second photovoltaic string to the first photovoltaic string, and further configured to: when the controller is not powered on, control the converter circuit to output the first voltage value.

14. The photovoltaic system according to claim 13, wherein the first element is a diode, a positive electrode of the diode is connected to the output end of the first photovoltaic module, and a negative electrode of the diode is connected to the input end of the second photovoltaic module.

15. The photovoltaic system according to claim 13, wherein the first element is a second switch, a non-movable end of the second switch is connected to the output end of the first photovoltaic module or the input end of the second photovoltaic module, and a movable end of the second switch is connected to the control circuit.

16. A photovoltaic system comprising:
   an adapter circuit,
   a first photovoltaic string, a second photovoltaic string, and
a controller, wherein:
the controller comprises an inverter or a combiner box;
the first photovoltaic string and the second photovoltaic string are configured to provide electric energy for the controller; and
the adapter circuit is configured to be connected to the first photovoltaic string in series, and further configured to connect the second photovoltaic string to the first photovoltaic string in series when a voltage of the first photovoltaic string is lower than a preset threshold,
wherein a first end of a first element is connected to an output end of the first photovoltaic string, a second end of the first element is connected to an input end of the controller, and the first element is configured to connect the first photovoltaic string to the controller when the controller is not powered on, and further configured to disable a path between the first photovoltaic string and the controller when the voltage is greater than the preset threshold;
a first input end of a converter circuit is connected to an input end of the second photovoltaic string, a second input end of the converter circuit is connected to an output end of the second photovoltaic string, a first output end of the converter circuit is connected to the first end of the first element, a second output end of the converter circuit is connected to the second end of the first element, the converter circuit is further connected to a control circuit, and the converter circuit is configured to connect the second photovoltaic string to the first photovoltaic string under control of the control circuit; and when the controller is not powered on, an output voltage value between the first output end and the second output end of the converter circuit is 0 or a value less than another threshold; and
the control circuit is configured to: when the voltage of the first photovoltaic string is lower than the preset threshold, control the converter circuit to connect the second photovoltaic string to the first photovoltaic string.

17. The photovoltaic system according to claim 16, wherein the first element is a diode, a positive electrode of the diode is connected to the output end of the first photovoltaic string, and a negative electrode of the diode is connected to the input end of the controller.

18. The photovoltaic system according to claim 16, wherein the first element is a second switch, a non-movable end of the second switch is connected to the output end of the first photovoltaic string or the input end of the controller, and a movable end of the second switch is connected to the control circuit.

* * * * *

UNITED STATES PATENT AND TRADEMARK OFFICE
CERTIFICATE OF CORRECTION

PATENT NO. : 11,626,738 B2
APPLICATION NO. : 17/353925
DATED : April 11, 2023
INVENTOR(S) : Yanzhong Zhang et al.

It is certified that error appears in the above-identified patent and that said Letters Patent is hereby corrected as shown below:

In the Specification

Column 7, Line 59, change "JOT" to --IOT--; and

In the Claims

Claim 1, Column 17, Line 58, change "the" to --a--.

Signed and Sealed this
Ninth Day of May, 2023

Katherine Kelly Vidal
*Director of the United States Patent and Trademark Office*